(12) United States Patent
Saitoh et al.

(10) Patent No.: US 7,309,533 B2
(45) Date of Patent: ***Dec. 18, 2007

(54) SUBSTITUTED ANTHRYL DERIVATIVE AND ELECTROLUMINESCENCE DEVICE USING THE SAME

(75) Inventors: Akihito Saitoh, Kanagawa (JP); Koichi Suzuki, Kanagawa (JP); Akihiro Senoo, Kanagawa (JP); Kazunori Ueno, Kanagawa (JP); Keiji Okinaka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/500,885

(22) Filed: Aug. 9, 2006

(65) Prior Publication Data

US 2006/0267488 A1    Nov. 30, 2006

Related U.S. Application Data

(62) Division of application No. 10/875,241, filed on Jun. 25, 2004, now Pat. No. 7,173,131.

(30) Foreign Application Priority Data

Jun. 27, 2003    (JP)    .............................. 2003-184261

(51) Int. Cl.
    *H01L 51/50*    (2006.01)
(52) U.S. Cl. ...................... 428/690; 428/917; 313/504; 313/506
(58) Field of Classification Search ................ 428/690, 428/917; 313/504, 506; 546/255, 285; 564/388; 548/529; 549/59
See application file for complete search history.

(56) References Cited

U.S. PATENT DOCUMENTS

| | | | |
|---|---|---|---|
| 4,539,507 A | 9/1985 | Van Slyke et al. | 313/504 |
| 4,720,432 A | 1/1988 | Van Slyke et al. | 428/457 |
| 4,885,211 A | 12/1989 | Tang et al. | 428/457 |
| 5,130,603 A | 7/1992 | Tokailin et al. | 313/504 |
| 5,151,629 A | 9/1992 | Van Slyke | 313/504 |
| 5,227,252 A | 7/1993 | Murayama et al. | 428/690 |
| 5,247,190 A | 9/1993 | Friend et al. | 257/40 |
| 5,317,169 A | 5/1994 | Nakano et al. | 257/40 |
| 5,382,477 A | 1/1995 | Saito et al. | 428/690 |
| 5,409,783 A | 4/1995 | Tang et al. | 428/690 |
| 5,514,878 A | 5/1996 | Holmes et al. | 257/40 |
| 5,635,308 A | 6/1997 | Inoue et al. | 428/690 |
| 5,672,678 A | 9/1997 | Holmes et al. | 528/373 |
| 5,726,457 A | 3/1998 | Nakano et al. | 257/40 |
| 5,759,444 A | 6/1998 | Enokida et al. | 252/301.16 |
| 6,093,864 A | 7/2000 | Tokailin et al. | 585/25 |
| 6,660,405 B2 | 12/2003 | Toguchi et al. | 428/690 |
| 6,713,192 B2 | 3/2004 | Fukuoka et al. | 428/690 |
| 2002/0048688 A1 | 4/2002 | Fukuoka et al. | 428/690 |
| 2004/0265632 A1* | 12/2004 | Okinaka et al. | 428/690 |
| 2005/0099115 A1 | 5/2005 | Saitoh et al. | 565/465 |
| 2006/0121312 A1* | 6/2006 | Yamada et al. | 428/690 |
| 2006/0125378 A1 | 6/2006 | Saitoh et al. | 313/504 |
| 2006/0255723 A1* | 11/2006 | Saitoh et al. | 313/504 |

FOREIGN PATENT DOCUMENTS

| | | |
|---|---|---|
| JP | 2-247278 | 10/1990 |
| JP | 02-282262 | 11/1990 |
| JP | 3008897 | 1/1991 |
| JP | 3-255190 | 11/1991 |
| JP | 03-284160 | 12/1991 |
| JP | 4-145192 | 5/1992 |
| JP | 5-202356 | 8/1993 |
| JP | 5-247460 | 9/1993 |
| JP | 08-012600 | 1/1996 |
| JP | 9-157643 | 6/1997 |
| JP | 9-202878 | 8/1997 |
| JP | 9-227576 | 9/1997 |
| JP | 10-72579 | 3/1998 |
| JP | 10-251633 | 9/1998 |
| JP | 11-8068 | 1/1999 |
| JP | 11-111460 | 4/1999 |
| JP | 11-228951 | 8/1999 |
| JP | 2000-007604 | 1/2000 |
| JP | 2001-035668 | 2/2001 |
| JP | 2001-240854 | 9/2001 |
| JP | 2001-284050 | 10/2001 |
| JP | 2005-015419 | 1/2005 |
| WO | WO 02/47440 | 6/2002 |
| WO | WO 2004-018588 | 3/2004 |

OTHER PUBLICATIONS

Burroughs et al., "Light-Emitting Diodes Based on Conjugated Polymers", *Nature*, vol. 347, Oct. 11, 1990, pp. 539-541.
Tang et al., "Organic Electroluminescent Diodes", *Appl. Phys. Lett.*, vol. 51, No. 12, Sep. 21, 1987, pp. 913-915.
Baldo et al., "Very High-Efficiency Green organic Light-Emitting Devices Based on Electrophosphorescence", *Appl. Phys. Lett.*, vol. 75, No. 1, Jul. 5, 1999, pp. 4-6.

* cited by examiner

*Primary Examiner*—Dawn L. Garrett
(74) *Attorney, Agent, or Firm*—Fitzpatrick, Cella, Harper & Scinto

(57) ABSTRACT

An anthryl derivative group substituted compound having a specific chemical structure is provided. This compound is used for producing an organic luminescent device which can emit luminescent hues with a very high purity and effect light emission with a high luminescence efficiency and a long lifetime.

4 Claims, 2 Drawing Sheets

SUBSTITUTED ANTHRYL DERIVATIVE AND ELECTROLUMINESCENCE DEVICE USING THE SAME

CROSS-REFERENCE TO RELATED APPLICATIONS:

This application is a division of application Ser. No. 10/875,241, filed Jun. 25, 2004 now U.S. Pat. No. 7,173,131.

BACKGROUND OF THE INVENTION

1. Field of the Invention

This invention relates to an organic luminescent device, and more particularly to a device which emits light upon application of an electric field to a thin film formed of an organic compound.

2. Related Background Art

The organic luminescent device is a device in which a thin film containing a fluorescent organic compound is held between an anode and a cathode, electrons and holes are injected from each electrode to produce excitons of the fluorescent organic compound, and the light is utilized that is emitted when the excitons return to the ground state.

In research made by Eastman Kodak Company in 1987 (Appl. Phys. Lett. 51, 913, 1987), a function-separated double-layer structure device is reported in which ITO (indium-tin-oxide) is used as an anode and an alloy of magnesium and silver is used as a cathode, where an aluminum quinolinol complex is used as an electron transporting material and a luminescent material, and a triphenylamine derivative is used as a hole transporting material, which device enables light of about 1,000 cd/m$^2$ to be emitted under application of a voltage of about 10 V. Related patents may include U.S. Pat. Nos. 4,539,507, 4,720,432 and 4,885,211.

By changing types of the fluorescent organic compound, emission from ultlaviolet up to infrared light is possible, and various compounds are recently energetically researched. For example, they are disclosed in U.S. Pat. Nos. 5,151,629, 5,409,783 and 5,382,477, and Japanese Patent Application Laid-Open Nos. H02-247278, H03-255190, H05-202356, H09-202878 and H09-227576.

Besides the organic luminescent devices making use of low-molecular weight materials as mentioned above, an organic emission device making use of a conjugated type high-molecular material is further reported by a group of members of Cambridge University (Nature, 347, 539, 1990). In this report, polyphenylene vinylene (PPV) is formed into a film by a coating system to ascertain luminescence in a single layer. Related patents of such a conjugated type high-molecular material may include U.S. Pat. Nos. 5,247, 190, 5,514,878 and 5,672,678, and Japanese Patent Application Laid-Open Nos. H04-145192 and H05-247460.

A phosphorescent organic luminescent device making use of an iridium complex such as Ir(ppy)$_3$ as a luminescent material (Appl. Phys. Lett. 75, 4, 1999) also has lately attracted attention, and a high emission efficiency is reported.

Recent advance in organic luminescent devices is noticeable, which are characterized by high luminance at a low applied voltage, variety of luminescence wavelengths, high-speed response, and thin-gage and light-weight, and hence they suggest possibility for extensive uses. However, there are many problems in durability such as changes over time in long-time use and deterioration due to oxygen-containing atmospheric gas or moisture. Where their application to full-color display and the like is taking into account, blue, green and red luminescence with much longer lifetime, higher conversion efficiency and higher color purity is required under the existing conditions.

As an example of materials containing an anthracene ring and organic luminescent devices, Japanese Patent Application Laid-Open No. H08-012600 discloses a phenyl anthracene derivative. This reports that a good organic film can be formed because of low crystallizability especially when used as a blue luminescent material or an electron transporting material. However, its luminescence efficiency and durability lifetime have been insufficient in practical use.

As another example, Japanese Patent Application Laid-Open Nos. H09-157643 and H10-072579 disclose an amino anthracene derivative and a diamino anthracene derivative, respectively. They report that green luminescence is obtained when used as a luminescent material. However, the device has a low luminescence efficiency, and also has been insufficient in practical use in regard to durability lifetime.

As still another example, Japanese Patent No. 3,008,897 discloses a device making use of a specific bianthryl compound as a luminescent material, which, however, has no disclosure in regard to luminescence efficiency and durability lifetime.

As a further example, Japanese Patent Application Laid-Open No. H11-008068 discloses a device making use of, as a luminescent material, a specific anthracene compound containing an olefin moiety, and reports that luminescence of from yellow light to red light is obtained. It, however, has been insufficient in practical use in regard to luminescence efficiency.

As a still further example, Japanese Patent Application Laid-Open No. 2001-284050 discloses a device having a luminescent medium layer which contains an anthracene derivative with a specific structure, an electron transporting compound and another luminescent compound. This reports that a red luminescent device improved in reliability is obtained. However, the device has an insufficient luminescence efficiency in practical use, and also it has been difficult to obtain blue luminescence because of device structure.

SUMMARY OF THE INVENTION

The present invention has been made in order to solve such problems the related background art has had. Accordingly, an object of the present invention is to provide an organic luminescent device which can emit luminescent hues with a very high purity, and effect light emission with high luminance at a high luminescence efficiency and a long lifetime, and also to provide an organic luminescent device which can be easily produced at relatively low cost.

The present inventors have conducted extensive studies in order to solve the above problems. As a result, they have accomplished the present invention.

That is, the present invention provides an anthryl derivative group substituted compound represented by the following general formula [1]:

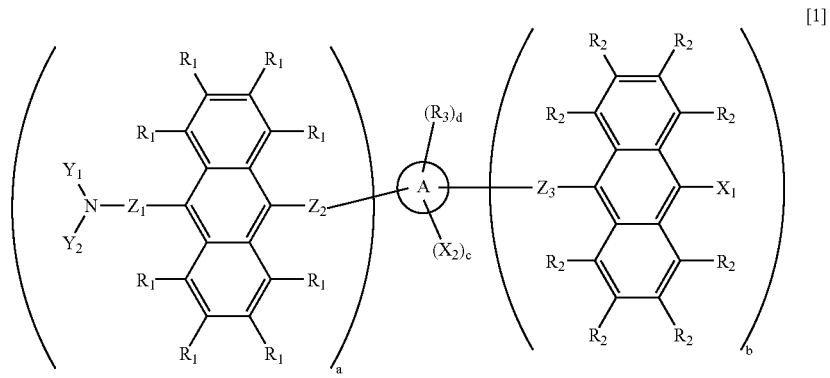

[1]

In the general formula [1], a is an integer of 0 to 4, and b+c+d is an integer of (6−a) or less;

A represents a molecular unit including an aromatic ring, a condensed multiple ring or a heterocyclic ring, selected from the group consisting of a terphenyl ring, a naphthalene ring, a phenanthrene ring, a pyrene ring, a tetracene ring, a pentane ring, a perylene ring, a pyrrole ring, a pyridine ring, a terpyridine ring, a thiophene ring and a terthiophene ring which may be substituted or unsubstituted, and a fluorene ring;

$Y_1$ and $Y_2$ are each independently a group selected from the group consisting of an alkyl group, an aralkyl group, an aryl group and a heterocyclic group which are substituted or unsubstituted; $Y_1$ and $Y_2$ may be combined together to form a ring; and $Y_1$'s and $Y_2$'s in different anthryl derivative groups may be the same or different;

$Z_1$ is a direct bond or a group selected from the group consisting of an arylene group and a divalent heterocyclic group which may be substituted or unsubstituted, and a divalent group having a bridging group, and may be the same or different when a is two or more;

$Z_2$ and $Z_3$ are each independently a direct bond or a group selected from the group consisting of an alkylene group, an alkenylene group, an alkynylene group, an aralkylene group and an arylene group which may be substituted or unsubstituted, and a divalent group having a bridging group, provided that $Z_2$ and $Z_3$ are not a direct bond where A is a fluorene ring; and when a is two or more, $Z_2$ may be the same or different, and when b is two or more, $Z_3$ may be the same or different;

$X_1$ is a hydrogen atom, a deuterium atom, a halogen atom, or a group selected from the group consisting of an alkyl group, an alkenyl group, an alkynyl group, an aralkyl group, an alkoxyl group and a sulfide group which may be substituted or unsubstituted, an aryl group, a heterocyclic group, and a substituted silyl group, and may be the same or different when b is two or more;

$X_2$ is a group selected from the group consisting of an aryl group and a heterocyclic group which may be substituted or unsubstituted, and may be the same or different when c is two or more; and $R_1$'s and $R_2$'s are each independently a hydrogen atom, a deuterium atom, a halogen atom, or a group selected from the group consisting of an alkyl group, an aryl group, an alkoxyl group and an amino group which may be substituted or unsubstituted; and $R_3$ is a deuterium atom, a halogen atom, or a group selected from the group consisting of an alkyl group and an alkoxyl group which may be substituted or unsubstituted.

The present invention also provides an anthryl derivative group substituted compound represented by the following general formula [2]:

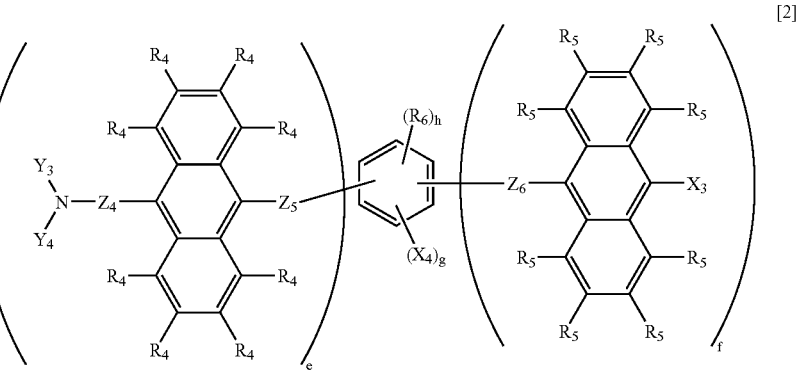

[2]

In the general formula [2], e is an integer of 0 to 4, and f+g+H is an integer of (6−e) or less, provided that e+f is 2 to 5, and h+g is ≧1 when e+f is 2;

$Y_3$ and $Y_4$ are each independently a group selected from the group consisting of an alkyl group, an aralkyl group, an aryl group and a heterocyclic group which may be substituted or unsubstituted, and a divalent group having a bridging group; $Y_3$ and $Y_4$ may be combined together to form a ring; and $Y_3$'s and $Y_4$'s in different anthryl derivative groups may be the same or different;

$Z_4$ is a direct bond, or a group selected from the group consisting of an arylene group and a divalent heterocyclic group which may be substituted or unsubstituted, and a divalent group having a bridging group, and may be the same or different when e is two or more;

$Z_5$ and $Z_6$ are each independently a direct bond or a group selected from the group consisting of an alkylene group, an alkenylene group, an alkynylene group, an aralkylene group and an arylene group which are substituted or unsubstituted, and a divalent group having a bridging group; and when e is two or more, $Z_5$ may be the same or different, and when f is two or more, $Z_6$ may be the same or different;

$X_3$ is a hydrogen atom, a deuterium atom, a halogen atom, or a group selected from the group consisting of an alkyl group, an alkenyl group, an alkynyl group, an aralkyl group, an alkoxyl group and a sulfide group which may be substituted or unsubstituted, an aryl group, a heterocyclic group, and a substituted silyl group, and may be the same or different when f is two or more;

$X_4$ is a group selected from the group consisting of an aryl group and a heterocyclic group which may be substituted or unsubstituted, and may be the same or different when g is two or more; and $R_4$'s and $R_5$'s are each independently a hydrogen atom, a deuterium atom, a halogen atom, or a group selected from the group consisting of an alkyl group, an aryl group, an alkoxyl group and an amino group which may be substituted or unsubstituted; and $R_6$ is a hydrogen atom, a deuterium atom, a halogen atom, or a group selected from the group consisting of an alkyl group and an alkoxyl group which may be substituted or unsubstituted, and may be the same or different when h is two or more.

DESCRIPTION OF THE PREFERRED EMBODIMENTS

Figure 1:
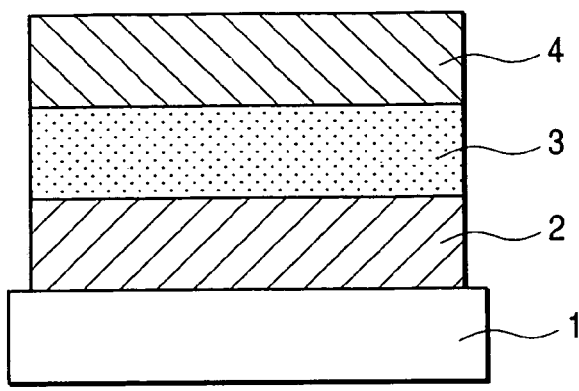
FIG. 1 is a sectional view showing an example of an organic luminescent device in the present invention.

The present invention is an anthryl derivative group substituted compound represented by the following general formula [1] or [2]:

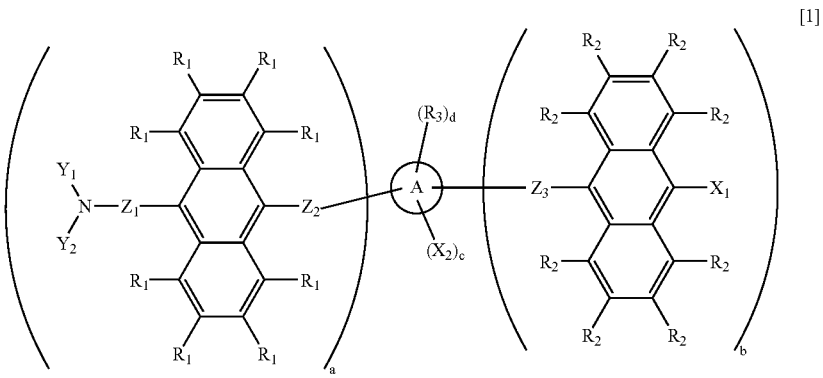

[1]

In the general formula [1], a is 0 to 4, and b+c+d is an integer of (6−a) or less;

A represents a molecular unit containing an aromatic ring, a condensed multiple ring or a heterocyclic ring, selected from the group consisting of a terphenyl ring, a naphthalene ring, a phenanthrene ring, a pyrene ring, a tetracene ring, a pentane ring, a perylene ring, a pyrrole ring, a pyridine ring, a terpyridine ring, a thiophene ring and a terthiophene ring which are connected to anthracene rings via or not via bridging groups $Z_2$ and $Z_3$ and are substituted or unsubstituted, and a fluorene ring which is connected to anthracene rings via bridging groups $Z_2$ and $Z_3$;

$Y_1$ and $Y_2$ are each a group selected from the group consisting of an alkyl group, an aralkyl group, an aryl group and a heterocyclic group which are substituted or unsubstituted and may be the same or different; $Y_1$ and $Y_2$ may be combined together to form a ring; and $Y_1$'s and $Y_2$'s in different anthryl derivative groups may be the same or different;

$Z_1$ is a direct bond or a group selected from the group consisting of an arylene group and a divalent heterocyclic group which are substituted or unsubstituted, and a divalent group having a bridging group, and $Z_1$'s in different anthryl derivative groups may be the same or different;

$Z_2$ and $Z_3$ are each a direct bond or a group selected from the group consisting of an alkylene group, an alkenylene group, an alkynylene group, an aralkylene group and an arylene group which are substituted or unsubstituted, and a divalent group having a bridging group; and when a is two or more, $Z_2$ may be the same or different, and when b is two or more, $Z_3$ may be the same or different;

$X_1$ is a hydrogen atom, a deuterium atom, a halogen atom, or a group selected from the group consisting of an alkyl group, an alkenyl group, an alkynyl group, an aralkyl group, an alkoxyl group and a sulfide group which are substituted or unsubstituted, an aryl group, a heterocyclic group, and a substituted silyl group, and may be the same or different when b is two or more;

$X_2$ is a group selected from the group consisting of an aryl group and a heterocyclic group which are substituted or unsubstituted, and may be the same or different when c is two or more; and $R_1$'s and $R_2$'s are each independently a hydrogen atom, a deuterium atom, a halogen atom, or a group selected from the group consisting of an alkyl group, an aryl group, an alkoxyl group and an amino group which are substituted or unsubstituted; and $R_3$ is a deuterium atom, a halogen atom, or a group selected from the group consisting of an alkyl group and an alkoxyl group which are substituted or unsubstituted, and may be the same or different when d is two or more.

$X_4$ is a group selected from the group consisting of an aryl group and a heterocyclic group which are substituted or unsubstituted, and may be the same or different when g is two or more; and $R_4$'s and $R_5$'s are each independently a hydrogen atom, a deuterium atom, a halogen atom, or a group selected from the group consisting of an alkyl group, an aryl group, an alkoxyl group and an amino group which are substituted or unsubstituted; and $R_6$ is a hydrogen atom, a deuterium atom, a halogen atom, or a group selected from the group consisting of an alkyl group and an alkoxyl group which are substituted or unsubstituted, and may be the same or different when h is two or more.

The compounds represented by the general formulas [1] and [2] may chiefly be used as materials for organic luminescent devices. In such use, when used as luminescent materials, they may each be used alone in a luminescent layer, and may be used for the purposes of dopant materials

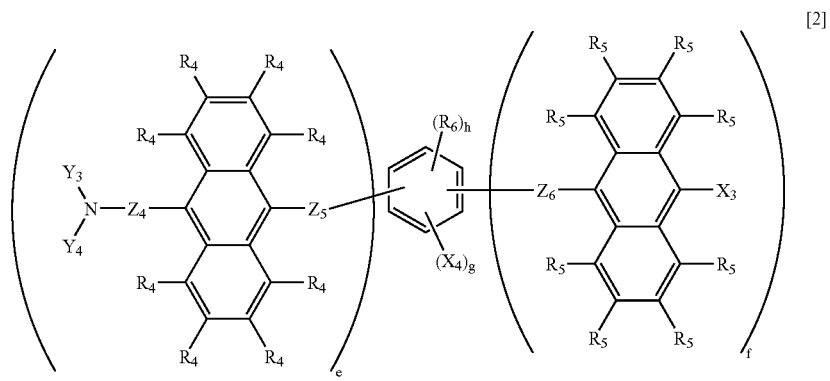

[2]

In the general formula [2], e is 0 to 4, and f+g+h is an integer of (6−e) or less, provided that e+f is 2 to 5, and h+g is ≧1 when e+f is 2;

$Y_3$ and $Y_4$ are each independently a group selected from the group consisting of an alkyl group, an aralkyl group, an aryl group and a heterocyclic group which may be substituted or unsubstituted, and a divalent group having a bridging group; $Y_3$ and $Y_4$ may be combined together to form a ring; and $Y_3$'s and $Y_4$'s in different anthryl derivative groups may be the same or different;

$Z_4$ is a direct bond or a group selected from the group consisting of an arylene group and a divalent heterocyclic group which are substituted or unsubstituted, and a divalent group having a bridging group, and may be the same or different when e is two or more;

$Z_5$ and $Z_6$ are each independently a direct bond or a group selected from the group consisting of an alkylene group, an alkenylene group, an alkynylene group, an aralkylene group and an arylene group which are substituted or unsubstituted, and a divalent group having a bridging group; and when e is two or more, $Z_5$ may be the same or different, and when f is two or more, $Z_6$ may be the same or different;

$X_3$ is a hydrogen atom, a deuterium atom, a halogen atom, or a group selected from the group consisting of an alkyl group, an alkenyl group, an alkynyl group, an aralkyl group, an alkoxyl group and a sulfide group which are substituted or unsubstituted, an aryl group, a heterocyclic group, and a substituted silyl group, and may be the same or different when f is two or more;

and host materials to obtain devices with high color purity, high luminescence efficiency and long lifetime.

The compounds represented by the general formulas [1] and [2] each have a core unit including an aromatic ring, a condensed multiple ring or a heterocyclic ring, the core unit being substituted with at least two anthryl groups as highly efficient luminescent units and each of the anthryl groups being substituted with an amino group, an amino group having a bridging group, an aryl group or the like. In the introduction of substituents, HOMO/LUMO levels of the material may be controlled by replacement of substituents, where blue, green and a luminescence color on a longer wavelength side can be obtained with ease (examples of calculation of HOMO/LUMO levels by B3LYP/3-21G: Exemplary Compound 15: −5.030/−1.877; Exemplary Compound 19: −4.805/−1.696). When used as dopant materials, changes in HOMO/LUMO levels by the replacement of substituents may be predicted by calculation, where the material can be designed and synthesized with ease according to the HOMO/LUMO levels of a host material. The same applies also when the compounds are used as host materials, and molecular designing is also easy while taking into account a difference in energy level between a hole transport layer and an electron transport layer. In the introduction of substituted amino groups, an improvement in hole transport performance can be expected. Substitution of the anthryl groups with amino groups or the like enables the compounds to have higher Tg (for example, Exemplary Compound 16 has Tg=215° C.) and affords a dendritic molecular shape of a starburst type, whereby a material having good film properties and heat stability can be obtained. Steric hindrance groups or fluorine atoms, the latter having so large electronegativity as to tend to cause electrostatic repulsion against adjacent molecules, may be introduced into the core molecule at the center, the anthryl groups or other aryl groups and the substituents on amino-groups, whereby it can be expected to restrain molecules from cohering to one another and especially improve the device lifetime. In addition to the foregoing consideration, with the materials of the present invnetion, considering that in virtue of an isotope effect, molecular vibration is controlled and thermal deactivation is inhibited, the idea of introducing molecular units substituted with deuterium has been incorporated in molecular designing. In the present invention, molecular designing has been made on the basis of such consideration, thus the present invention has been made.

When the compounds are used as dopant materials, they may each be in a dopant concentration of from 0.01% to 80%, and preferably from 1% to 40%, in respect to the host material. The dopant material may be contained uniformly, or with a concentration gradient, in the whole layer formed of the host material, or may partially be contained in some regions to form regions of a host material layer containing no dopant material.

The present invention is described below in detail.

Specific examples of the bridging groups, substituents and molecular unit A or core unit in the compounds represented by the general formulas [1] and [2] are shown below.

In the compounds represented by the general formulas [1] and [2], the bridging group may include, but is not limited to, a substituted or unsubstituted arylene group and a divalent heterocyclic ring group as shown later.

In the compounds represented by the general formulas [1] and [2], the divalent group having a bridging group may include, but is not limited to, an alkylene group, an alkenylene group, an alkynylene group, an aralkylene group and an amino group which are substituted or unsubstituted, a substituted silyl group, an ether group, a thioether group and a carbonyl group which have a bridging group.

The substituted or unsubstituted alkyl group may include, but is not limited to, a methyl group, a methyl-d1 group, a methyl-d3 group, an ethyl group, an ethyl-d5 group, an n-propyl group, an n-butyl group, an n-pentyl group, an n-hexyl group, an n-heptyl group, an n-octyl group, an n-decyl group, an iso-propyl group, an iso-propyl-d7 group, an iso-butyl group, a sec-butyl group, a tert-butyl group, a tert-butyl-d9 group, an iso-pentyl group, a neopentyl group, a tert-octyl group, a fluoromethyl group, a difluoromethyl group, a trifluoromethyl group, a 2-fluoroethyl group, a 2,2,2-trifluoroethyl group, a perfluoroethyl group, a 3-fluoropropyl group, a perfluoropropyl group, a 4-fluorobutyl group, a perfluorobutyl group, a 5-fluoropentyl group, a 6-fluorohexyl group, a chloromethyl group, a trichloromethyl group, a 2-chloroethyl group, a 2,2,2-trichloroethyl group, a 4-chlorobutyl group, a 5-chloropentyl group, a 6-chlorohexyl group, a bromomethyl group, a 2-bromoethyl group, an iodomethyl group, a 2-iodoethyl group, a hydroxymethyl group, a hydroxyethyl group, a cyclopropyl group, a cyclobutyl group, a cyclopentyl group, a cyclohexyl group, a cyclopentylmethyl group, a cyclohexylmethyl group, a cyclohexylethyl group, a 4-fluorocyclohexyl group, a norbornyl group and an adamantyl group.

The substituted or unsubstituted aralkyl group may include, but is not limited to, a benzyl group, a 2-phenylethyl group, a 2-phenylisopropyl group, a 1-naphthylmethyl group, a 2-naphthylmethyl group, a 2-(1-naphthyl)ethyl group, a 2-(2-naphthyl)ethyl group, a 9-anthrylmethyl group, a 2-(9-anthryl)ethyl group, a 2-fluorobenzyl group, a 3-fluorobenzyl group, a 4-fluorobenzyl group, a 2-chlorobenzyl group, a 3-chlorobenzyl group, a 4-chlorobenzyl group, a 2-bromobenzyl group, a 3-bromobenzyl group and a 4-bromobenzyl group.

The substituted or unsubstituted alkenyl group may include, but is not limited to, a vinyl group, an allyl group, a 2-propenyl group, a 1-propenyl group, an iso-propenyl group, a 1-butenyl group, a 2-butenyl group, a 3-butenyl group and a styryl group.

The substituted or unsubstituted alkynyl group may include, but of course is not limited to, an acetylenyl group, a phenylacetylenyl group and a 1-propynyl group.

The substituted or unsubstituted aryl group may include, but is not limited to, a phenyl group, a phenyl-d5 group, a 4-methylphenyl group, a 4-methoxylphenyl group, a 4-ethylphenyl group, a 4-fluorophenyl group, a 4-trifluorophenyl group, a 3,5-dimethylphenyl group, a 2,6-diethylphenyl group, a mesityl group, a 4-tert-butylphenyl group, a ditolylaminophenyl group, a biphenyl group, a terphenyl group, a 1-naphthyl group, a 1-naphthyl-d7 group, a 2-naphthyl-d7 group, a 1-anthryl group, a 2-anthryl group, a 9-anthryl group, a 9-anthryl-d9 group, a 2-phenanthryl group, a 3-phenanthryl group, a 4-phenanthryl group, a 9-phenanthryl group, a 9-phenanthryl-d9 group, a 1-pyrenyl group, a 1-pyrenyl-d9 group, a 2-pyrenyl group, a 4-pyrenyl group, a tetracenyl group, a pentacenyl group, a fluorenyl group, a triphenylenyl group and a perilenyl group.

The substituted or unsubstituted heterocyclic group may include, but is not limited to, a pyrrolyl group, a pyridyl group, a pyridyl-d5 group, a bipyridyl group, a methylpyridyl group, a terpyrrolyl group, a thienyl group, a thienyl-d4 group, a terthienyl group, a propylthienyl group, a furyl group, a furyl-d4 group, an indolyl group, a 1,10-phenanthrolyl group, a phenazinyl group, a quinolyl group, a carbazolyl group, an oxazolyl group, an oxadiazolyl group, a thiazolyl group and a thiadiazolyl group.

The substituted or unsubstituted alkylene group may include, but is not limited to, a methylene group, a methylene-d2 group, a difluoromethylene group, an ethylene group, an ethylene-d4 group, a perfluoroethylene group, a propylene group, an iso-propylene group, a butylene group and a 2,2-dimethylpropylene group.

The substituted or unsubstituted aralkylene group may include, but is not limited to, a benzylene group, a 2-phenylethylene group, a 2-phenylisopropylene group, a 1-napthylmethylene group, a 2-napthylmethylene group, a 9-anthrylmethylene group, a 2-fluorobenzylene group, a 3-fluorobenzylene group, a 4-fluorobenzylene group, a 4-chlorobenzylene group and a 4-bromobenzylene group.

The substituted or unsubstituted alkenyl group may include, but of course is not limited to, a vinylene group, an iso-propenylene group, a styrylene group and a 1,2-diphenylvinylene group.

The substituted or unsubstituted alkynyl group may include, but of course is not limited to, an acetylenylene group and a 1,2-phenylacetylenylene group.

The substituted or unsubstituted arylene group may include, but is not limited to, a phenylene group, a biphenylene group, a tetrafluorophenylene group, a dimethylphenylene group, a naphthylene group, an anthrylene group, a phenanthrylene group, a pyrenylene group, a tetracenylene group, a pentacenylene group and a perylenylene group.

The substituted or unsubstituted divalent heterocyclic group may include, but is not limited to, a furylene group, a pyrrolylene group, a pyridylene group, a terpyridylene group, a thienylene group, a terthienylene group, an oxazolylene group, a thiazolylene group and a carbazolylene group.

The substituted or unsubstituted amino group (—NR'R") may be a group in which R' and R" each represent a hydrogen atom, a deuterium atom, any of an alkylene group, an alkenylene group, an alkynylene group, an aralkylene group and an amino group each having a bridging group consisting: of the above substituted or unsubstituted alkyl group, aralkyl group, aryl group or heterocyclic group or the substituted or unsubstituted arylene group or divalent heterocyclic group, a substituted silyl group, an ether group, a thioether group, or a carbonyl group, and may include, but is not limited to, e.g., an amino group, an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N-phenyl-N-tolylamino group, an N,N-ditolylamino group, an N-methyl-N-phenylamino group, an N,N-dianisolylamino group, an N-mesityl-N-phenylamino group, an N,N-dimethylamino group, an N-phenyl-N-(4-tert-butylphenyl)amino group and an N-phenyl-N-(4-trifluoromethylphenyl)amino group.

The substituted or unsubstituted alkoxyl group may include an alkyloxyl group and an aralkyloxyl group each having the above substituted or unsubstituted alkyl group or aralkyl group, or an aryloxyl group having the above substituted or unsubstituted aryl group or heterocyclic group, and may include, but is not limited to, e.g., a methoxyl group, an ethoxyl group, a propoxyl group, a 2-ethyl-octyloxyl group, a phenoxyl group, a 4-tert-butylphenoxyl group, a benzyloxyl group and a thienyloxyl group.

The substituted or unsubstituted sulfide group may include an alkyl sulfide group and an aralkyl sulfide group each having the above substituted or unsubstituted alkyl group or aralkyl group, or an aryl sulfide group having the above substituted or unsubstituted aryl group or heterocyclic group, and may include, but is not limited to, e.g., a methyl sulfide group, an ethyl sulfide group, a phenyl sulfide group and a 4-methylphenyl sulfide group.

The molecular unit A may include, but is not limited to, a benzene ring, a biphenyl ring, a terphenyl ring, a naphthalene ring, a phenanthrene ring, an anthracene ring, a tetracene ring, a benzanthracene ring, a chrysene ring, a pyrene ring, a perylene ring, a choranthlene ring, a triphenylene ring, a thiophene ring, a pyridine ring, a pyrazine ring, a pyrazole ring, a pyrrole ring, a terthiophene ring, a terpyridine ring, a terpyrrole ring, a triazine ring, a carbazole ring, a benzimidazole ring, a benzothiazole ring, a quinoline ring, a quinoxaline ring, a quinazoline ring, a phthalazine ring, a diphenylmethane ring, tetraphenylsilane, tetraphenylgermane and tetraphenylmethane which contain deuterium and are substituted or unsubstituted.

Substituents the above substituents, bridging groups and molecular unit A may further have may include, but is not limited to, a deuterium atom, an alkyl group such as a methyl group, an ethyl group, an n-propyl group, an n-butyl group, an n-pentyl group, an n-hexyl group, an n-heptyl group, an n-octyl group, an n-decyl group, an iso-propyl group, an iso-butyl group, a sec-butyl group, a tert-butyl group, an iso-pentyl group, a neopentyl group, a tert-octyl group, a benzyl group or a 2-phenylethyl group; an aralkyl group; an alkoxyl group such as a methoxyl group, an ethoxyl group, a propoxyl group, a 2-ethyl-octyloxyl group, a phenoxyl group, a 4-tert-butylphenoxyl group or a benzyloxyl group; an aryl group such as a phenyl group, a 4-methylphenyl group, a 4-ethylphenyl group, a 3-chlorphenyl group, a 3,5-dimethylphenyl group, a triphenylamino group, a biphenyl group, a terphenyl group, a naphtyl group, an anthryl group, a phenanthryl group or a pyrenyl group; a heterocyclic group such as a pyridyl group, a bipyridyl group, a methylpyridyl group, a thienyl group, a terthienyl group, a propylthienyl group, a furyl group, a quinolyl group, a carbazolyl group or an N-ethylcarbazolyl group; a halogen atom, a hydroxyl group, a cyano group and a nitro group.

In the compounds represented by the general formulas [1] and [2], it is preferable that at least one of $Y_1$, $Y_2$, $Z_1$ to $Z_3$, $X_1$, $X_2$ and $R_1$ to $R_3$ is a group containing a deuterium atom, or a deuterium atom and at least one of $Y_3$, $Y_4$, $Z_4$ to $Z_6$, $X_3$, $X_4$ and $R_4$ to $R_6$ is a group containing a deuterium atom, or a deuterium atom.

Typical examples of the compounds represented by the general formulas [1] and [2] are shown below. However, it should be noted that examples are by no means limited to these.

Exemplary Compounds

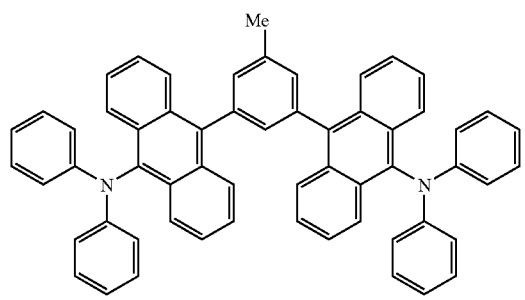

1

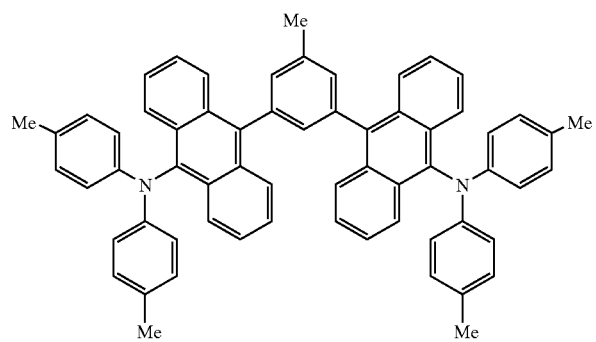

2

-continued
3
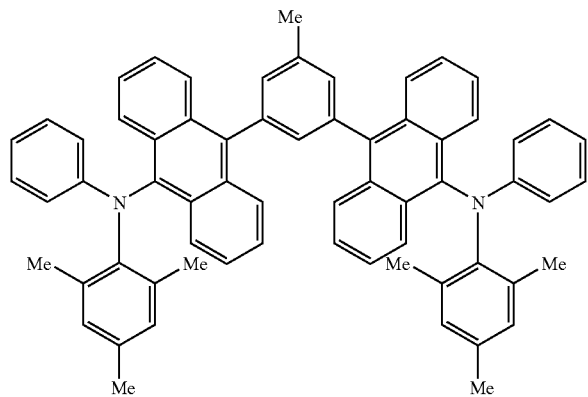
4
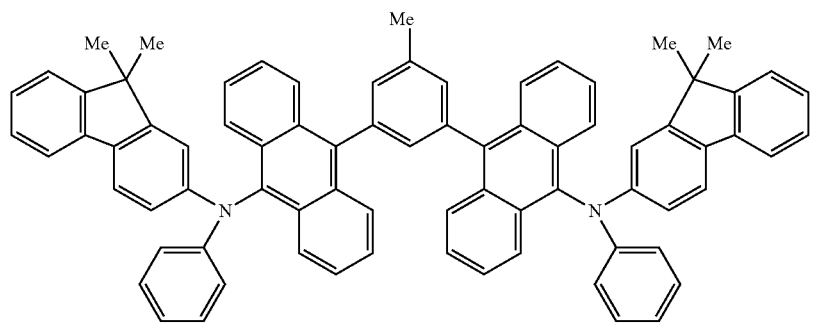
5 6
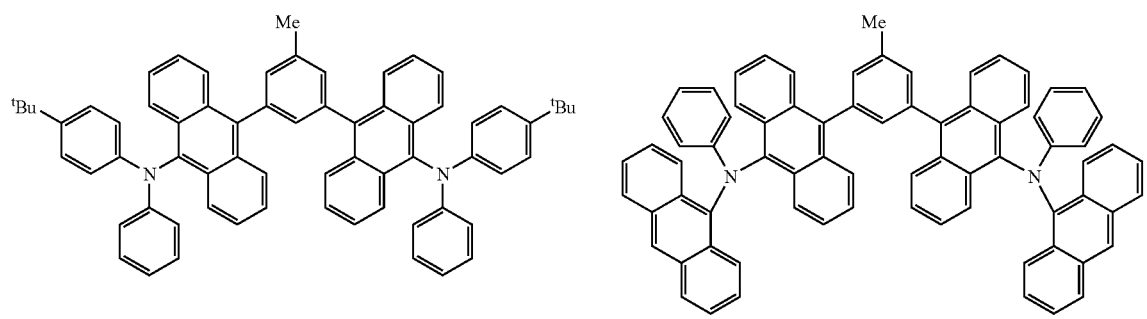
7 8
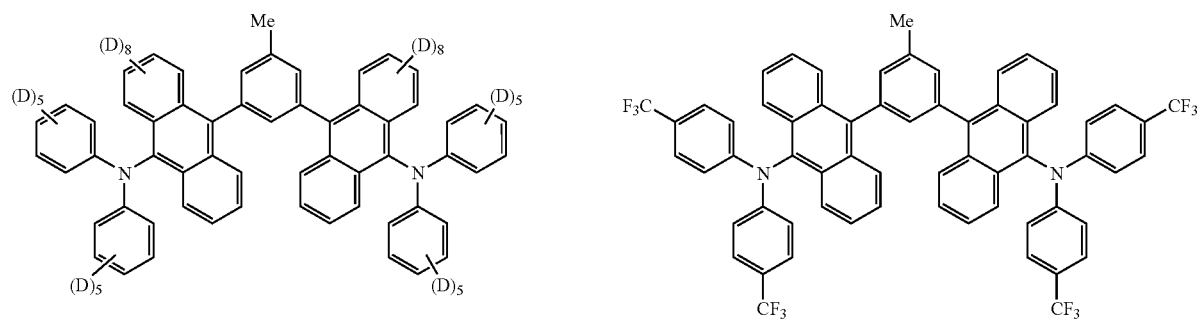

-continued
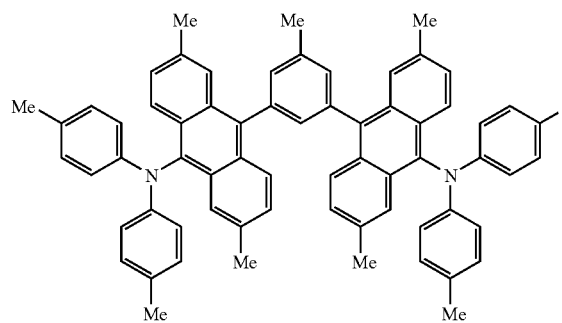
9
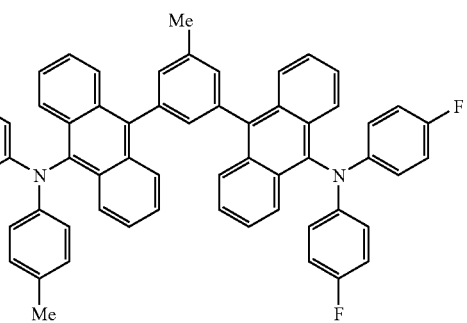
10
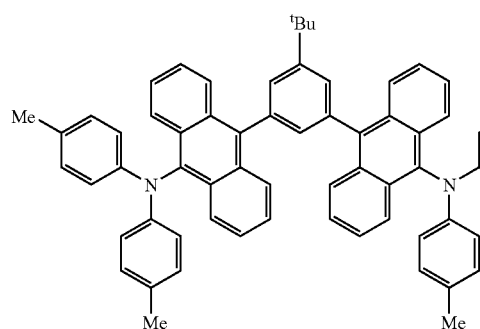
11
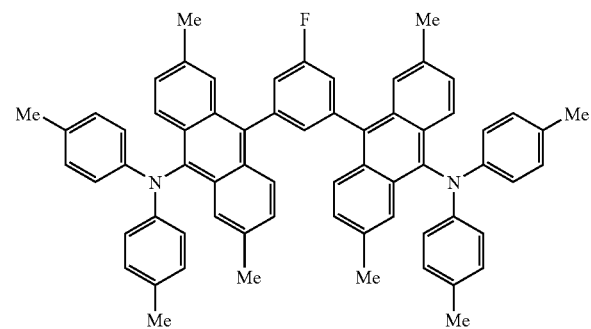
12
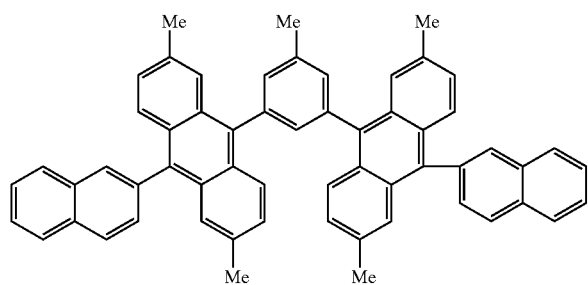
13
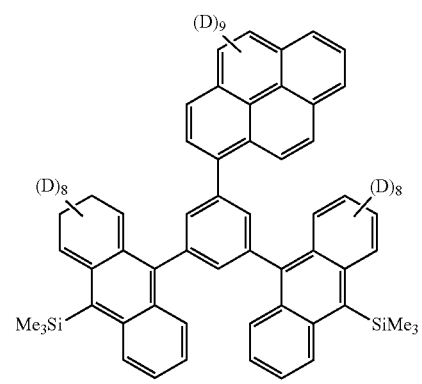
14
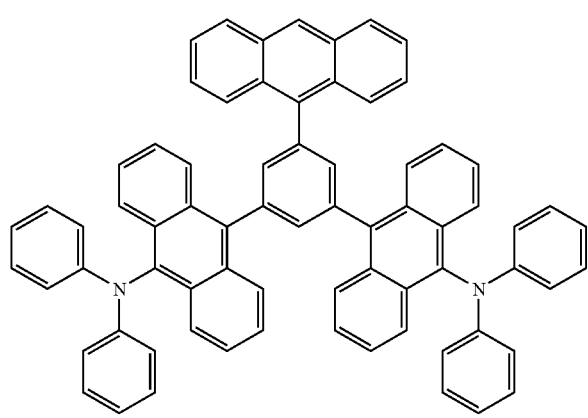
15

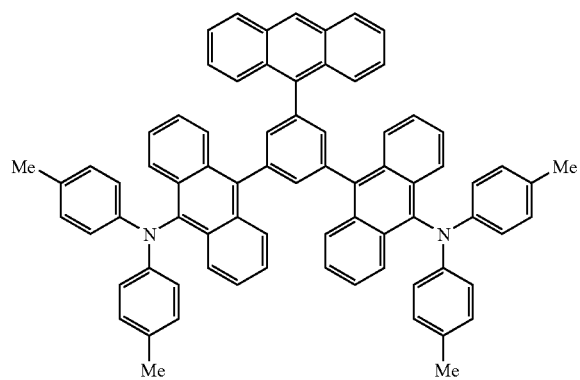
17
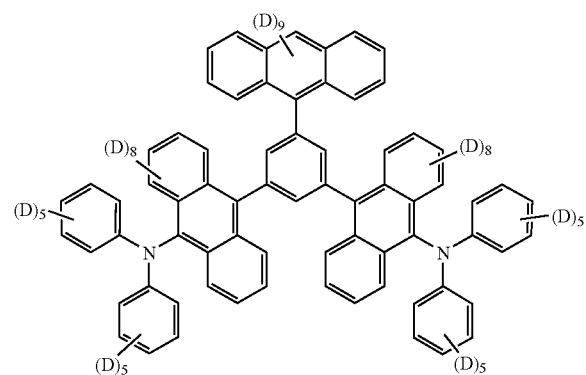
17
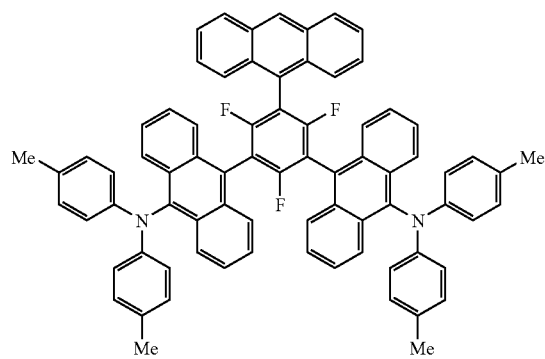
18
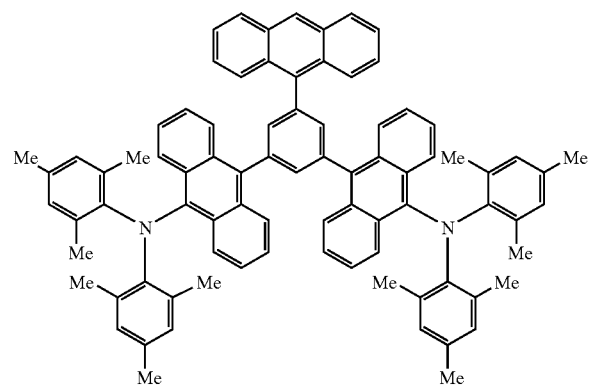
19
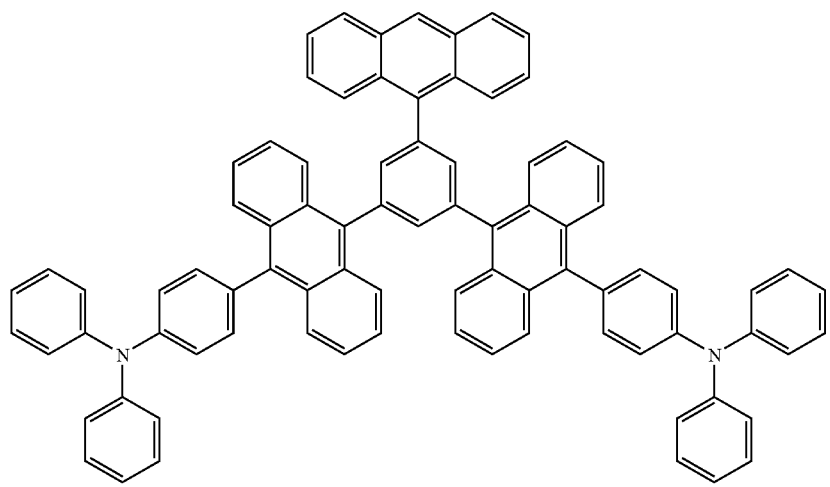
20

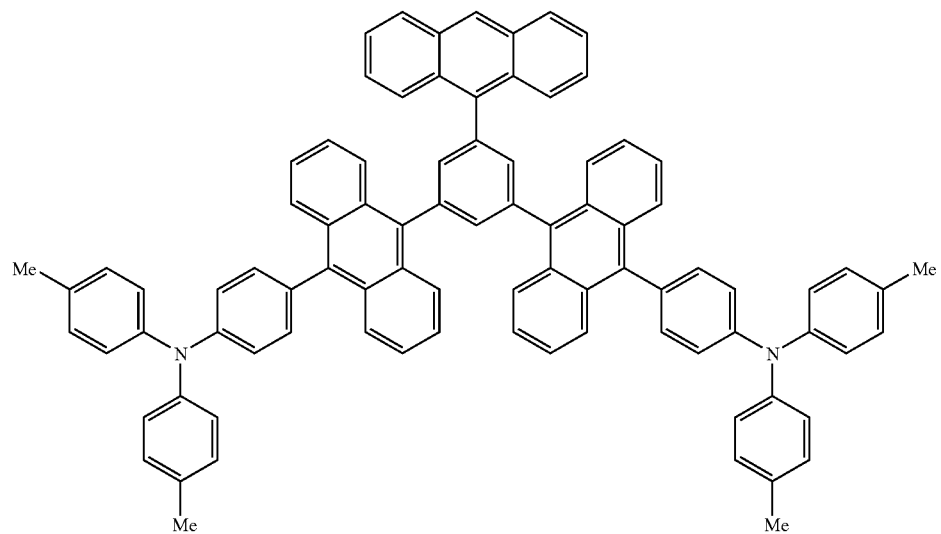
21
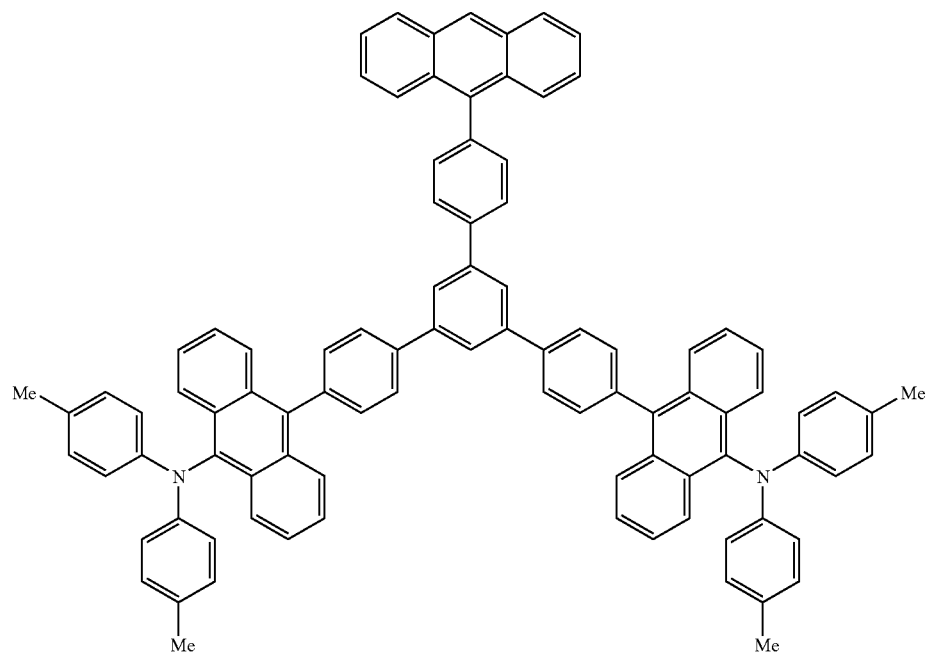
22
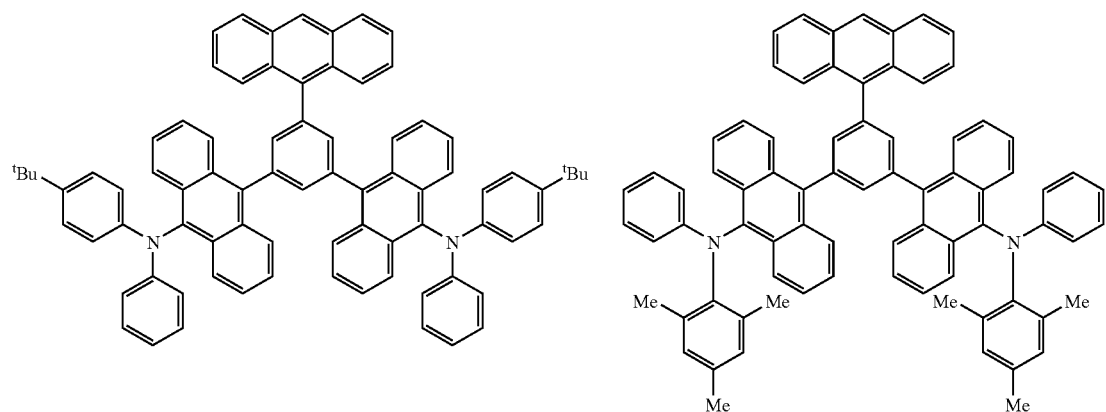
23
24

25
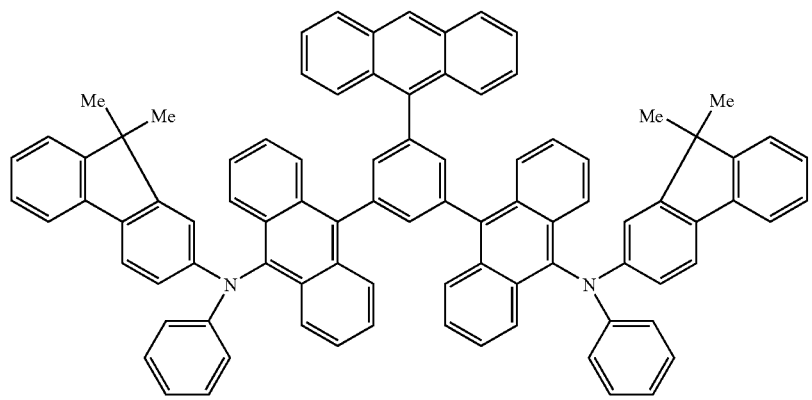
26
27
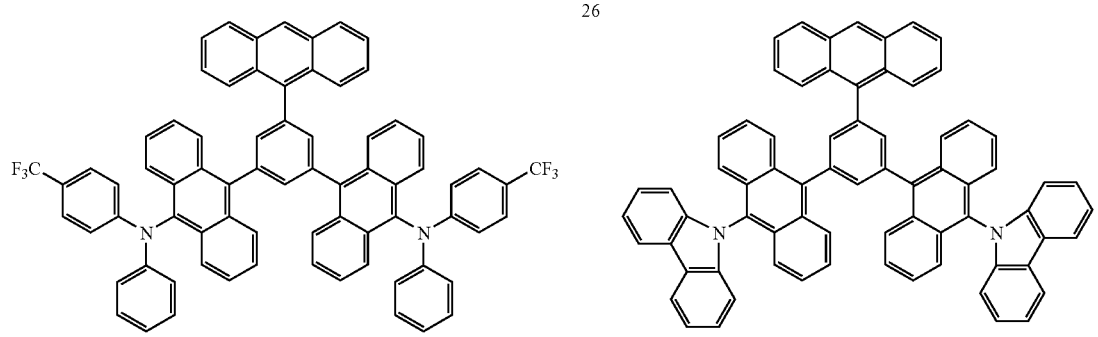
28
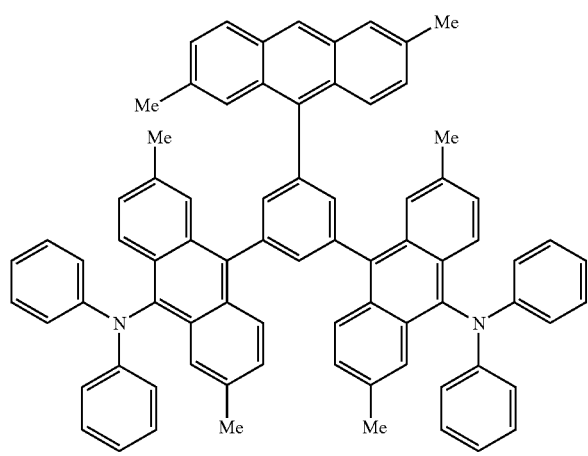
29
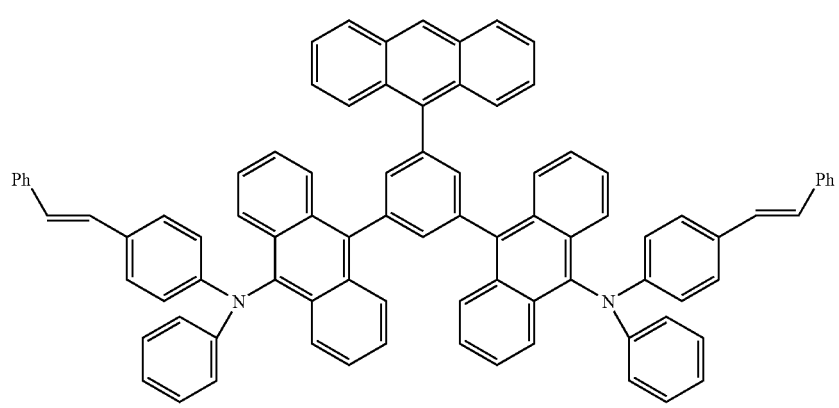

-continued
30
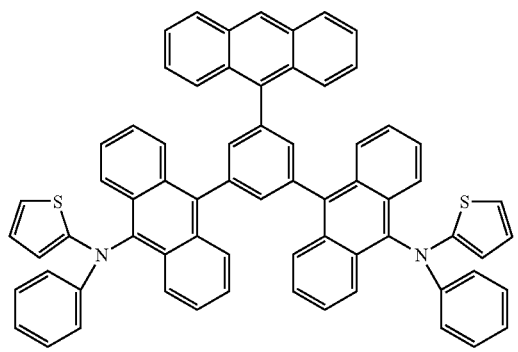
31
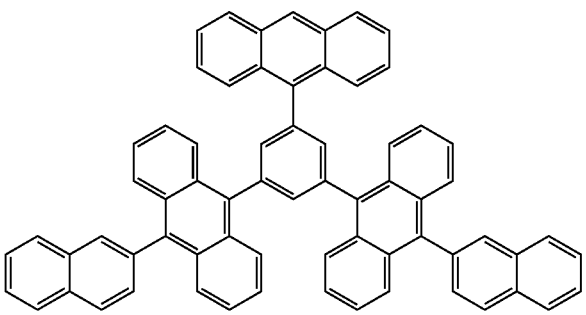
32
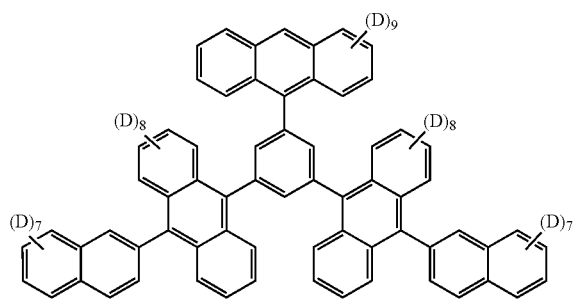
33
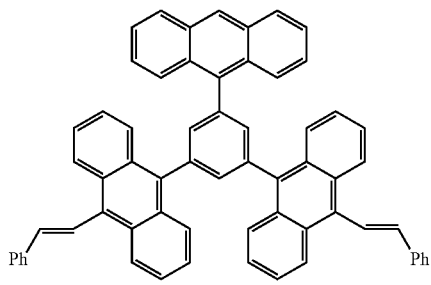
34
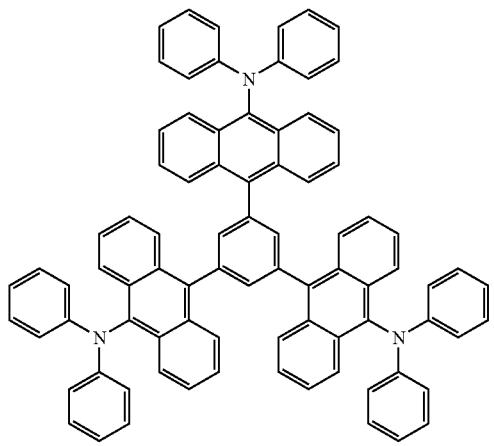
35
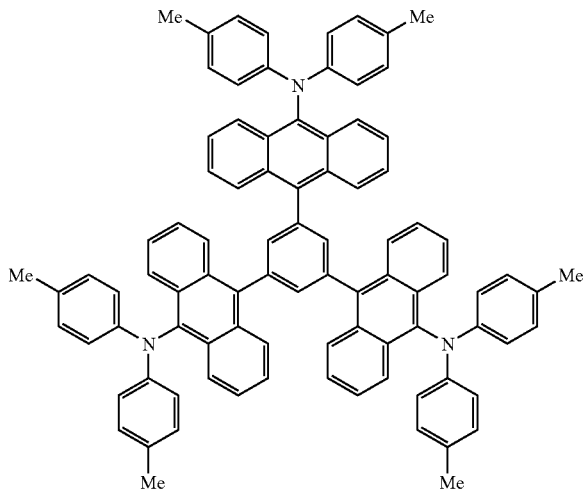

-continued
36
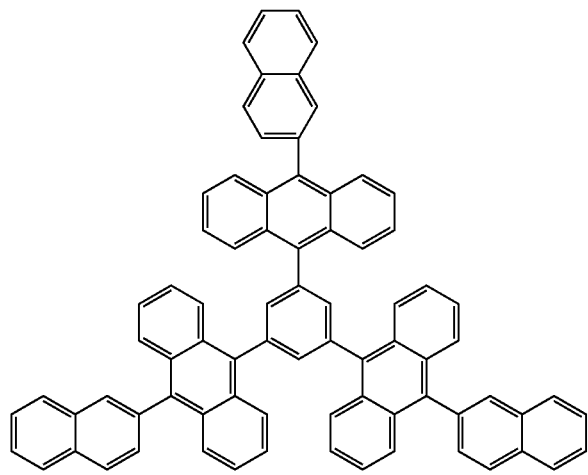
37
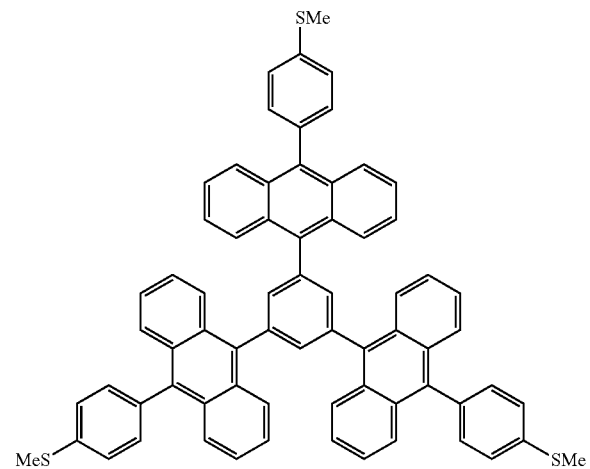
38
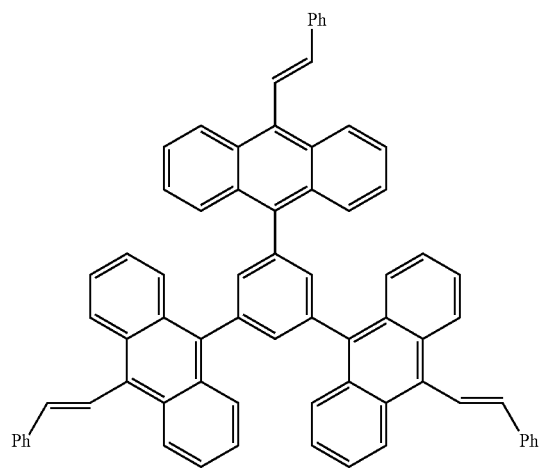
39
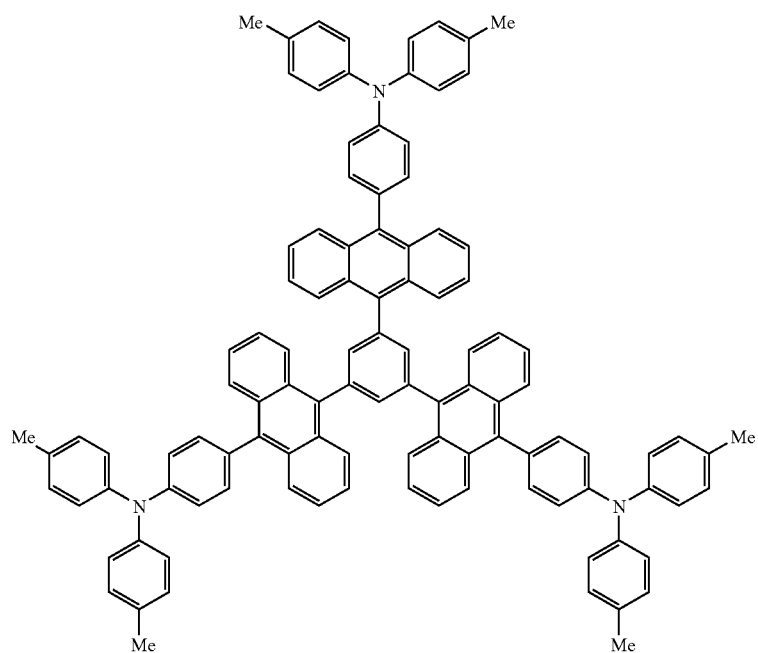

-continued
40
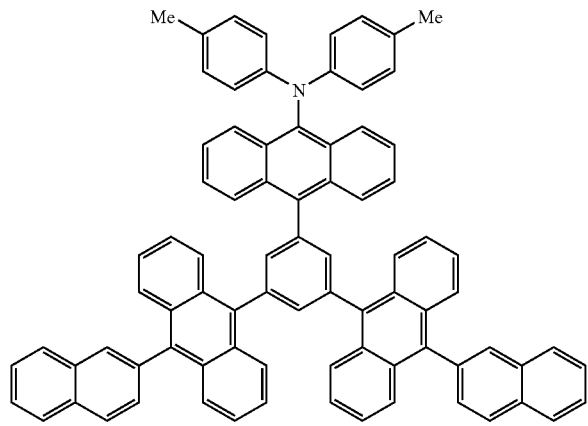
41
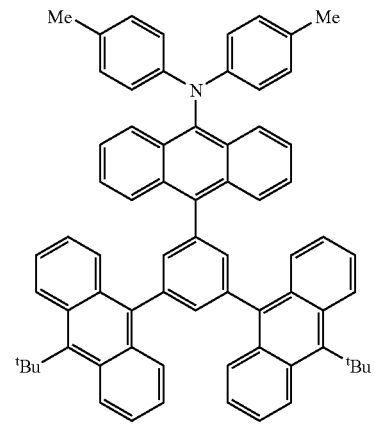
42
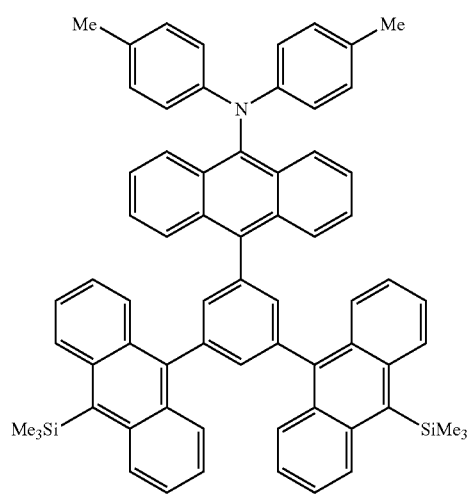
43
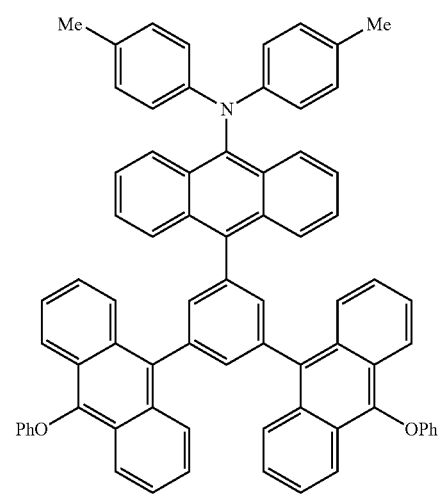
44
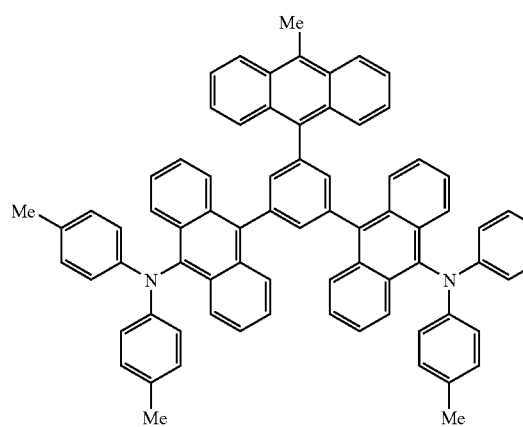
45
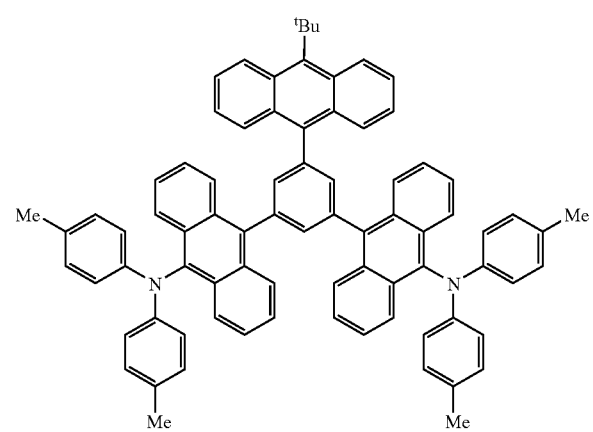

-continued
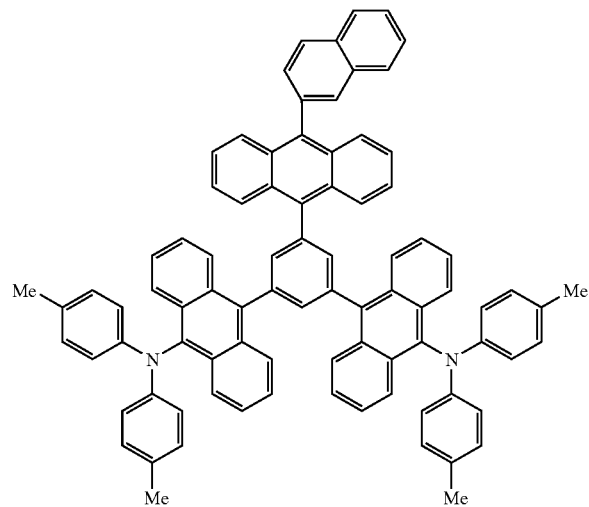
46
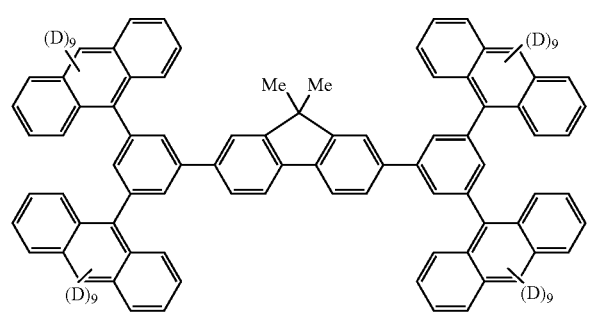
47
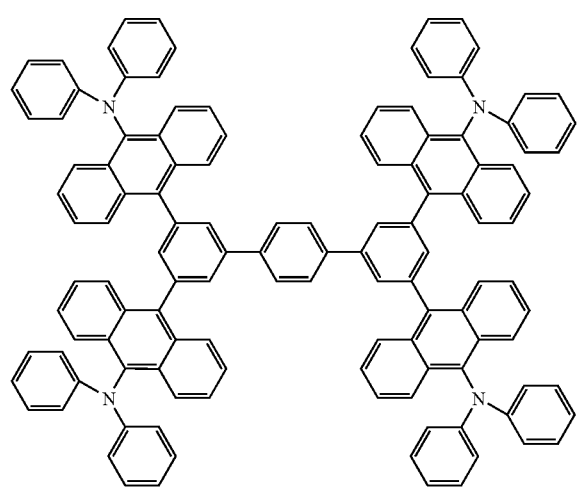
48
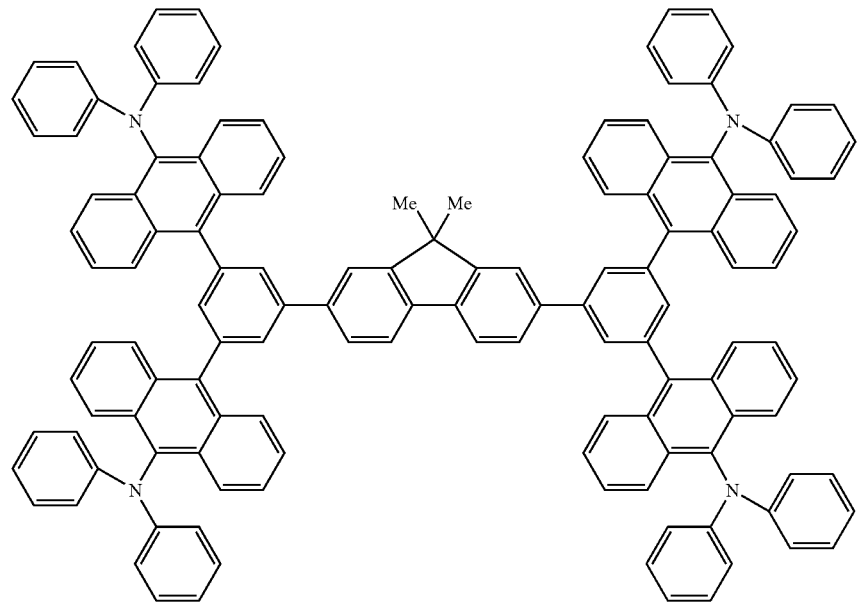
49

-continued
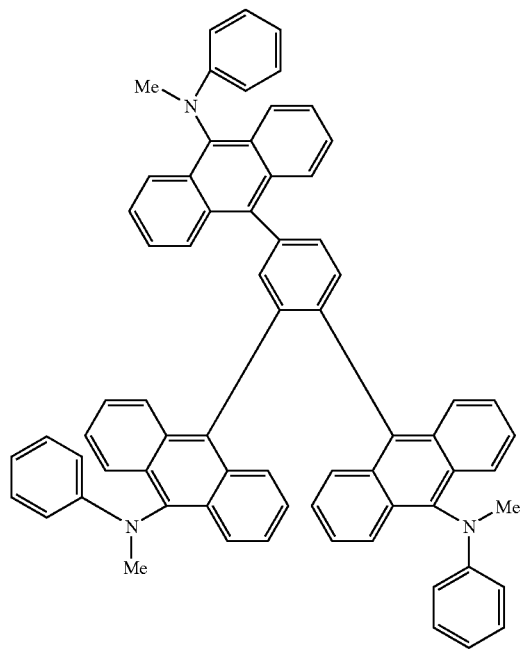
50
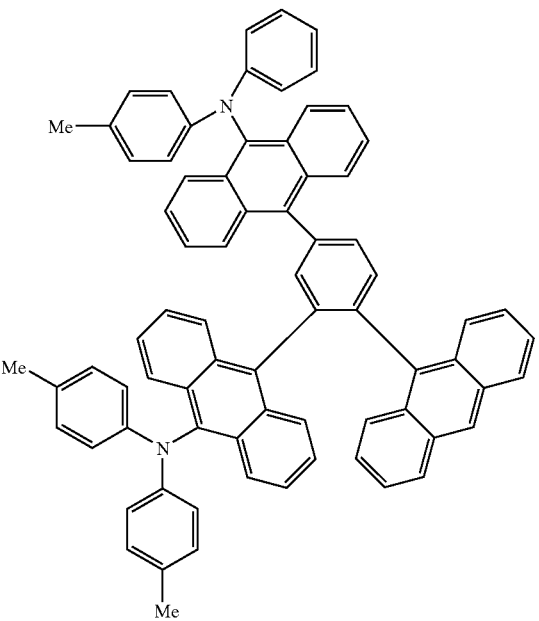
51
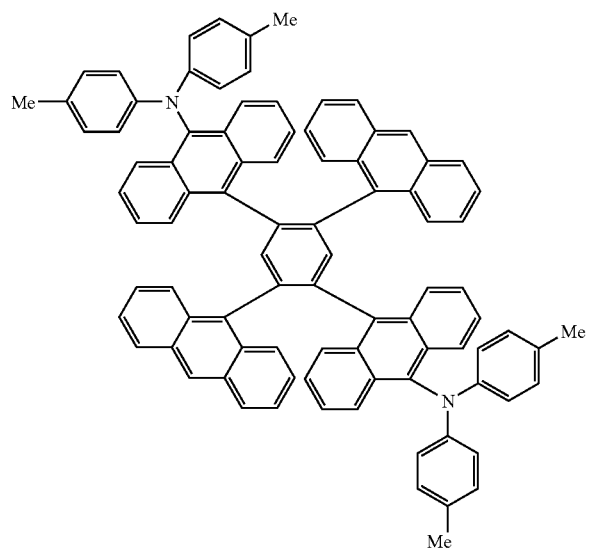
52
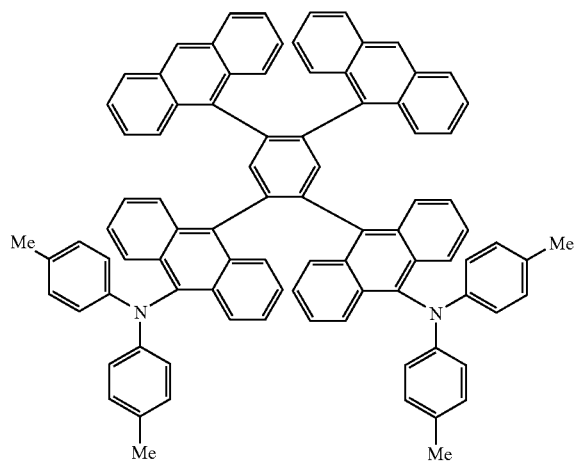
53

-continued
54
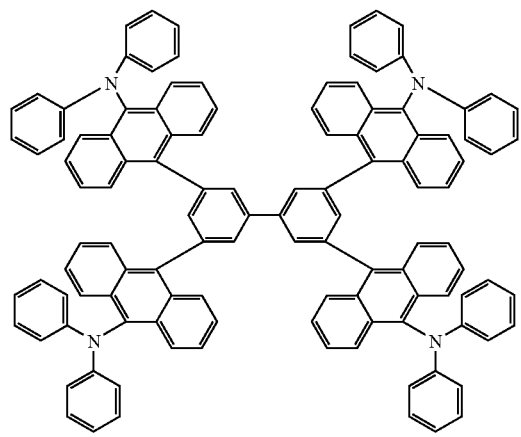
55
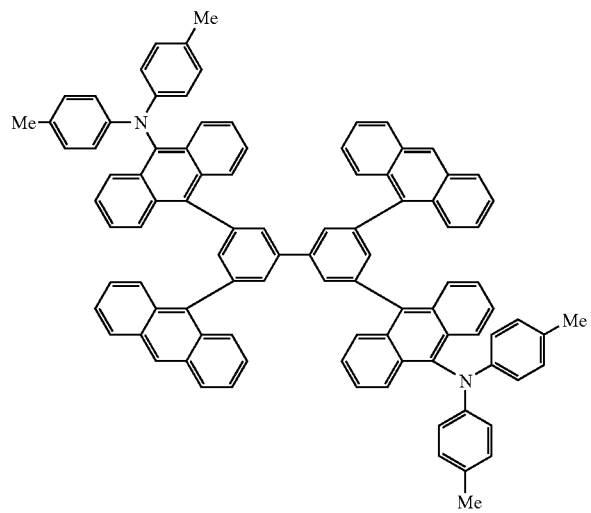
56
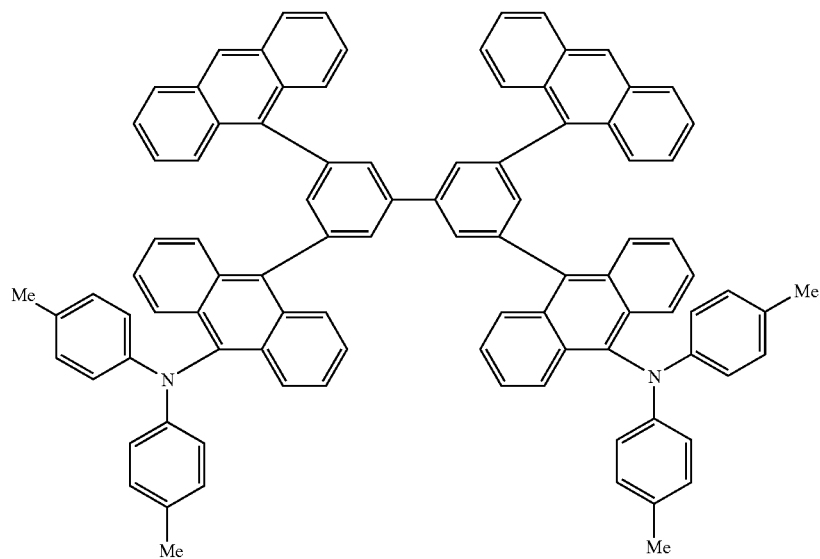
57
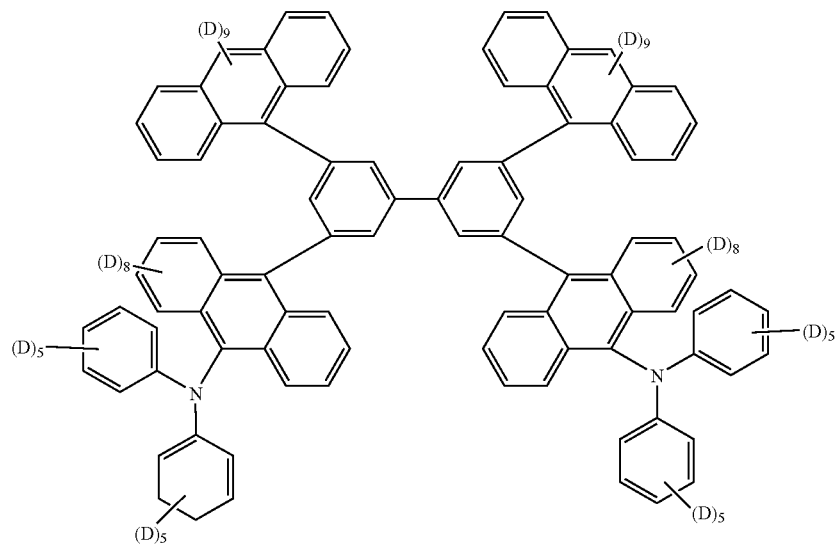

58

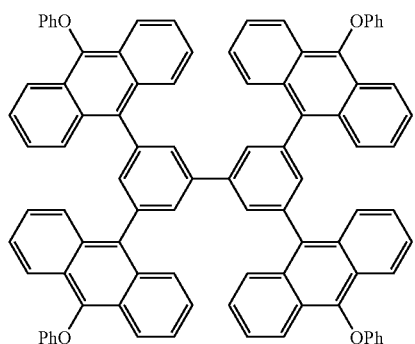

59

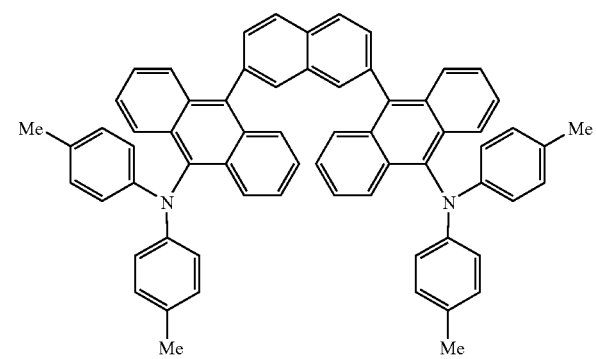

60

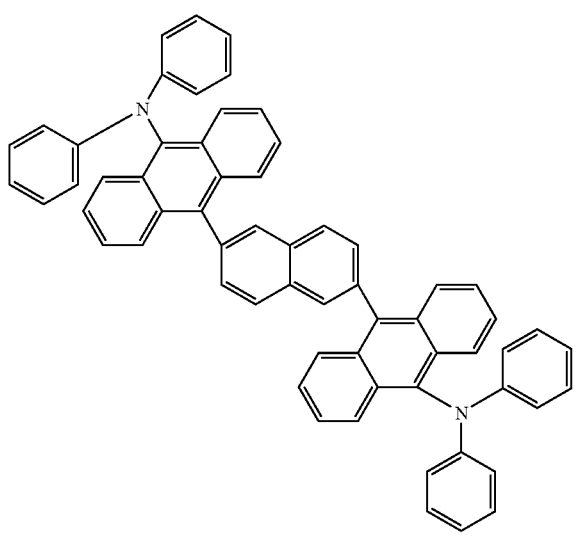

61

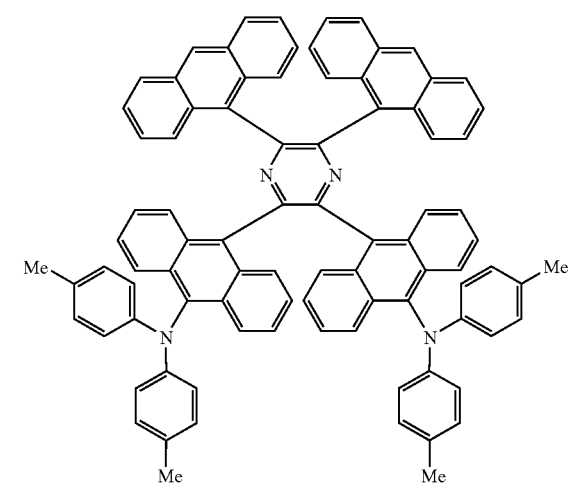

The organic luminescent device of the present invention is described below in detail.

The organic luminescent device of the present invention is an organic luminescent device having at least a pair of electrodes at least one of which comprises a transparent or semitransparent anode or cathode, and one or more layers containing an organic compound, held between the electrodes (the anode and the cathode), wherein;

at least one layer of the layers containing an organic compound contains at least one compound of the anthryl derivative group substituted compounds represented by the general formulas [1] and [2].

Preferred examples of the organic luminescent device of the present invention are shown in FIGS. 1 to 5. Here, reference numerals shown in the drawings denote the following:

1: a substrate;
2: an anode;
3: a luminescent layer;
4: a cathode;
5: a hole transport layer;
6: an electron transport layer;
7: a hole injection layer; and
8: a hole/exciton blocking layer.

FIG. 1 is a sectional view showing an example of the organic luminescent device of the present invention. FIG. 1 shows a constitution in which an anode 2, a luminescent layer 3 and a cathode 4 in this order are provided on a substrate 1. The luminescent device used here is useful where the device has by itself hole transportability, electron transportability and luminescence function, or where compounds having the respective properties are used in mixture.

Figure 2:
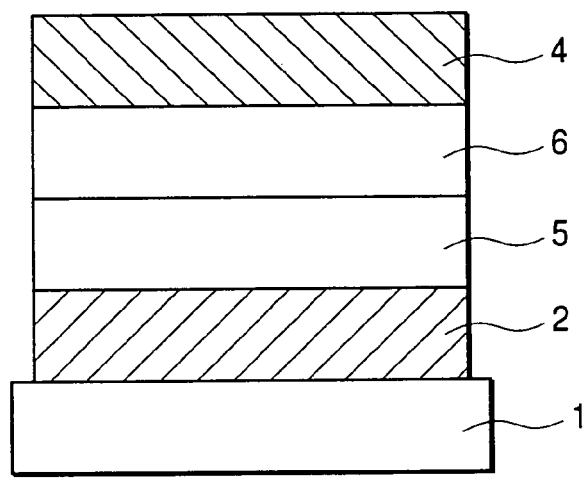
FIG. 2 is a sectional view showing another example of an organic luminescent device in the present invention.

FIG. 2 is a sectional view showing another example in the organic luminescent device of the present invention. FIG. 2 shows a constitution in which an anode 2, a hole transport layer 5, an electron transport layer 6 and a cathode 4 in this order are provided on a substrate 1. The device in this case is useful where a material having either hole transport function or electron transport function or both the functions is used as a luminescent material in each layer and is used in combination with a mere hole transporting material or electron transporting material having no luminescent property. Also, in this case, the luminescent layer 3 is composed of either of the hole transport layer 5 and the electron transport layer 6.

Figure 3:
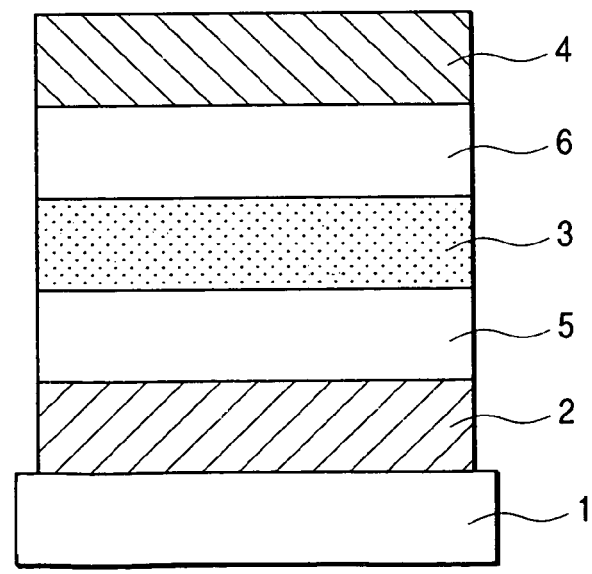
FIG. 3 is a sectional view showing still another example of an organic luminescent device in the present invention.

FIG. 3 is a sectional view showing still another example in the organic luminescent device of the present invention. FIG. 3 shows a constitution in which an anode 2, a hole transport layer 5, a luminescent layer 3, an electron transport layer 6 and a cathode 4 in this order are provided on a substrate 1. This device is one in which the functions of carrier transport and luminescence are separated, and is used in appropriate combination with a compound having respective functions of a hole transport function, an electron transport function and a luminescence function. This broadens the range of choice for materials and also makes it possible to use various compounds having different luminescence wavelengths. Hence, luminescence hues can be diversified. In addition, this also makes it possible to confine carriers or excitons effectively in the luminescent layer 3 at the middle to achieve an improvement in luminescence efficiency.

Figure 4:
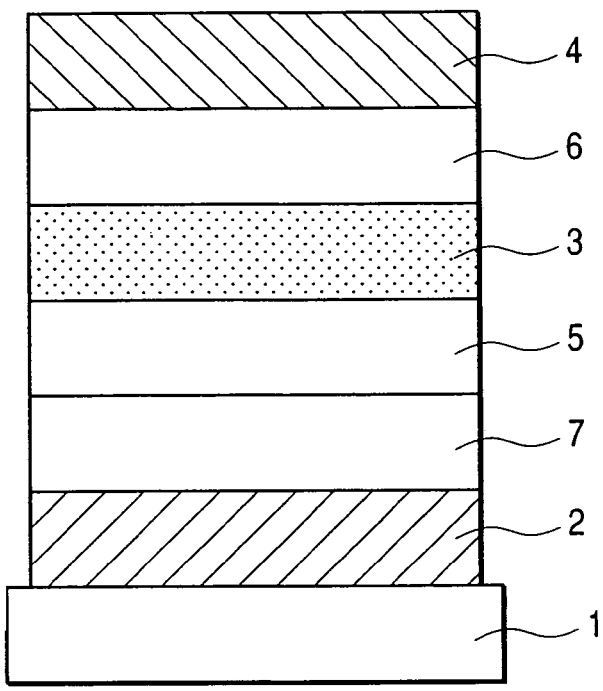
FIG. 4 is a sectional view showing a further example of an organic luminescent device in the present invention.

FIG. 4 is a sectional view showing a further example in the organic luminescent device of the present invention. FIG. 4 shows a constitution in which in the constitution as shown in FIG. 3, a hole injection layer 7 is inserted on the anode 2 side. This is effective in improving adherence between the anode 2 and the hole transport layer 5 and improving hole injection, and also is effective in low-voltage luminescence.

Figure 5:
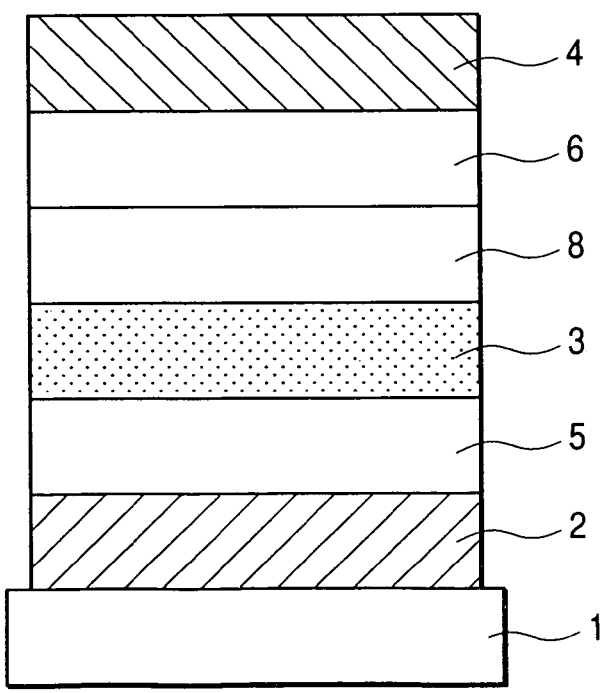
FIG. 5 is a sectional view showing a still further example of an organic luminescent device in the present invention.

FIG. 5 is a sectional view showing a still further example in the organic luminescent device of the present invention. FIG. 5 shows a constitution in which in the constitution as shown in FIG. 3, a layer (hole/exciton blocking layer 8) which prevents holes or excitons from passing through toward the cathode 4 side, is inserted between the luminescent layer 3 and the electron transport-layer 6. A compound having a very high ionization potential may be used in the hole/exciton blocking layer 8 to provide a constitution highly effective in improving luminescence efficiency.

Note that FIGS. 1 to 5 show quite basic constitutions to the end, and the constitutions of the organic luminescent device using the compound of the present invention are by no means limited thereto. For example, the device can have various constitutions such that insulating layers are provided at the interfaces between electrodes and organic layers, an adhesive layer or an interference layer is provided, and the hole transport layer is constituted of two layers having different ionization potentials.

The compounds represented by the general formulas [1] and [2] may be used in any of the forms shown in FIGS. 1 to 5.

In particular, an organic layer making use of the compound of the present invention is useful as the luminescent layer, the electron transport layer or the hole transport layer. Also, a layer formed by vacuum deposition (vacuum evaporation) or solution coating can not easily cause crystallization and is superior in stability over time.

In the present invention, any of the anthryl derivative group substituted compounds represented by the general formulas [1] and [2] may be used as a constituent of, in particular, the luminescent layer, and may also optionally be used together with a hole transporting compound, a luminescent compound and/or an electron transporting compound which is/are known in the art.

Examples of such compounds are given below.

A hole injecting and transporting material is preferably one which facilitates the injection of holes from the anode and has mobility sufficient to transport the injected holes to the luminescent layer. Low-molecular and high-molecular materials having a hole injection and transport function may include, but is not limited to, triarylamine derivatives, phenylenediamine derivatives, triazole derivatives, oxadiazole derivatives, imidazole derivatives, pyrazoline derivatives, pyrazolone derivatives, oxazole derivatives, fluorenone derivatives, hydrazone derivatives, stilbene derivatives, phthalocyanine derivatives, porphyrin derivatives, poly(vinylcarbazole), poly(silylene), poly(thiophene), and other conductive high-molecular materials. Some specific examples of these are shown below.

Low-Molecular Hole Injecting and Transporting Materials:

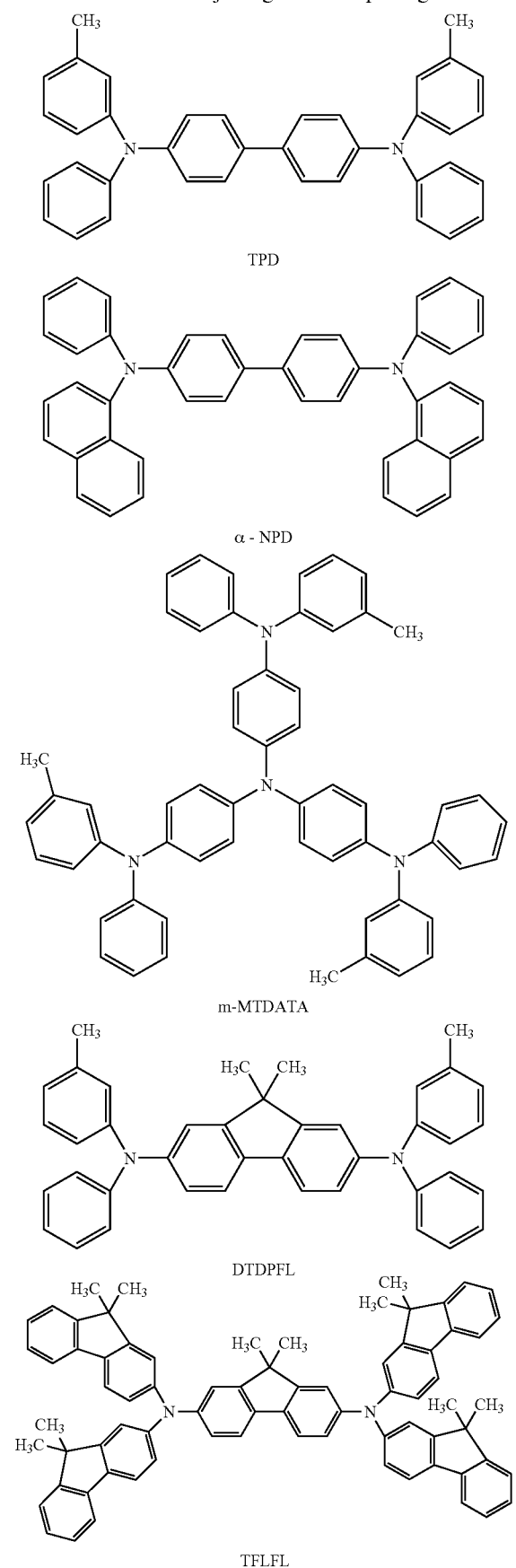

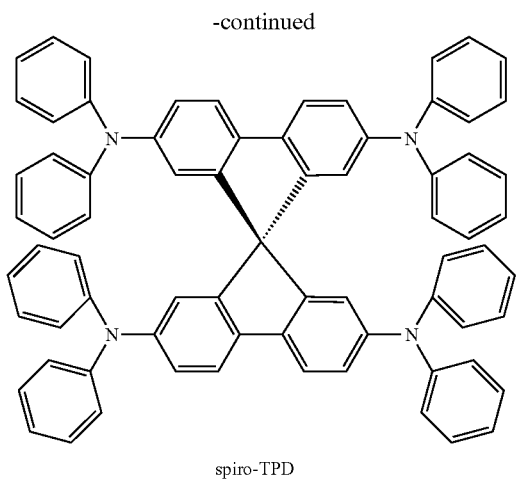
spiro-TPD
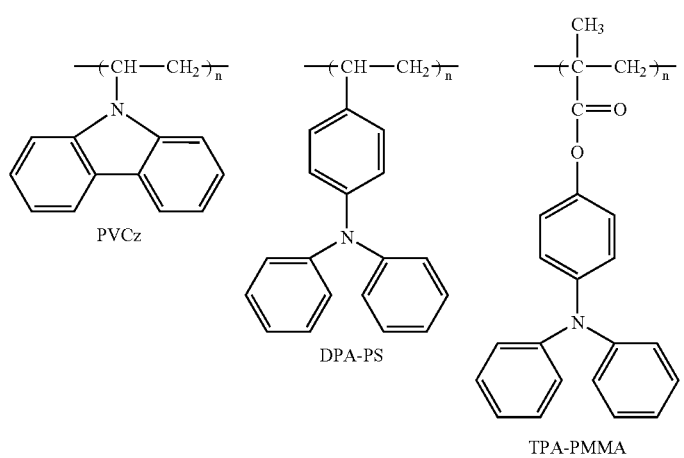
spiro-NPD
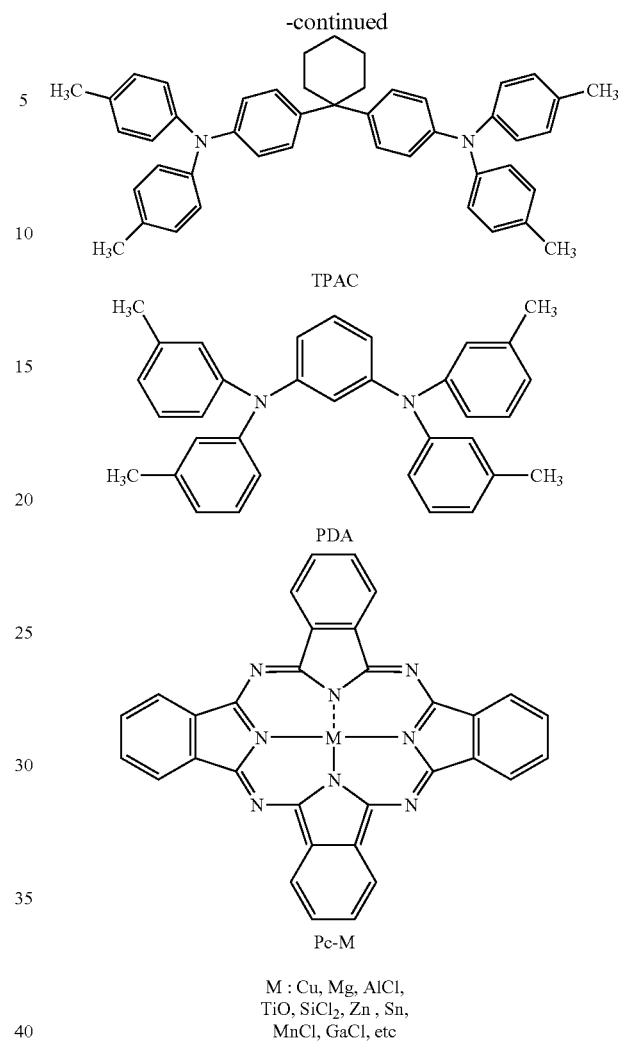
TPAC
PDA
Pc-M
M : Cu, Mg, AlCl,
TiO, SiCl₂, Zn, Sn,
MnCl, GaCl, etc
High-Molecular Hole Injecting and Transporting Materials:
PVCz
DPA-PS
TPA-PMMA

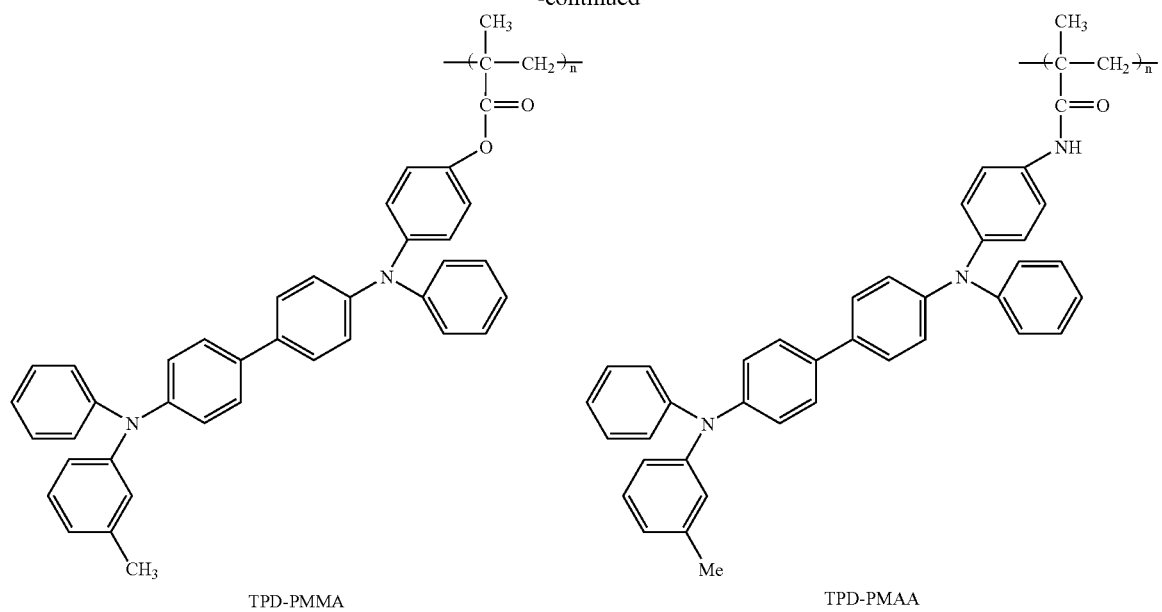

TPD-PMMA            TPD-PMAA

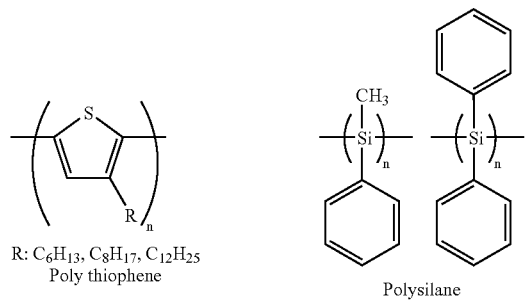

R: C$_6$H$_{13}$, C$_8$H$_{17}$, C$_{12}$H$_{25}$
Poly thiophene            Polysilane

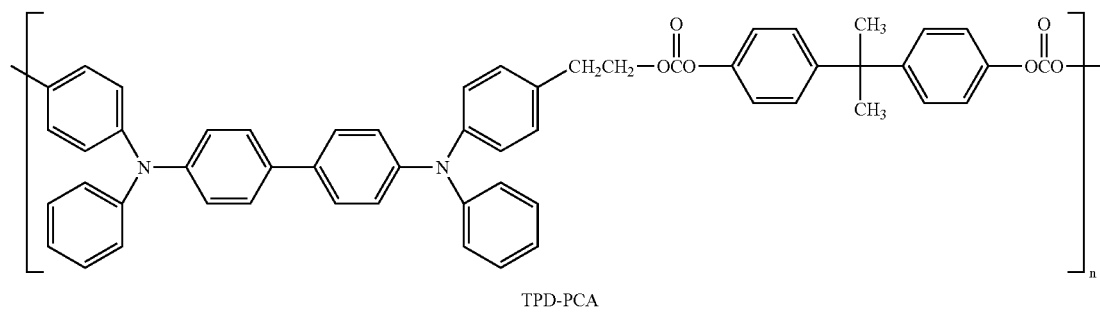

TPD-PCA

Materials concerned chiefly in luminescence function which are usable besides the anthryl derivative group substituted compounds represented by the general formulas [1] and [2] may include, but is not limited to, high-molecular derivatives such as polycyclic condensation aromatic compounds (e.g., naphthalene derivatives, phenanthrene derivatives, fluorene derivatives, pyrene derivatives, tetracene derivatives, coronene derivatives, chrysene derivatives, perylene derivatives, 9,10-diphenylanthracene derivatives, and rubrene), quinacridone derivatives, acridone derivatives, coumarine derivatives, pyrane derivatives, Nile Red, pyrazine derivatives, benzoimidazole derivatives, benzothiazole derivatives, benzoxazole derivatives, stilbene derivatives, organometallic complexes (e.g., organoaluminum complexes such as tris(8-quinolinolato)aluminum, and organoberyllium complexes), poly(phenylenevinylene) derivatives, poly(fluorene) derivatives, poly(phenylene) derivatives, poly(thienylenevinylene) derivatives, and poly (acetylene) derivatives. Some specific examples of these are shown below.

Low-Molecular Luminescent Materials:
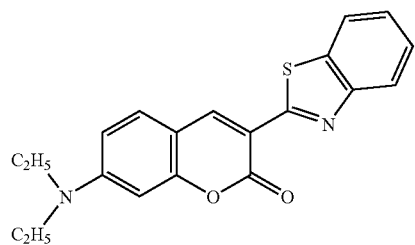
Coumarin6
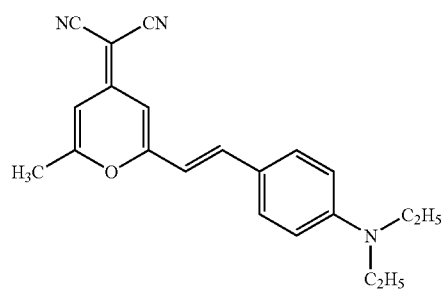
DCM-1
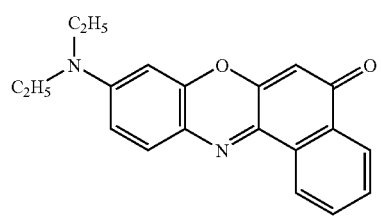
Nile red
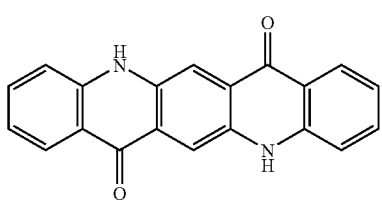
Quinacridone
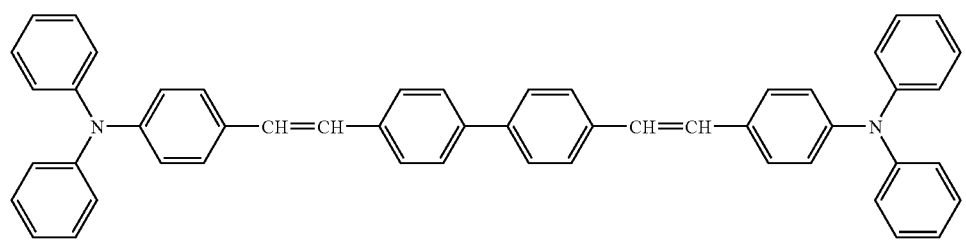
DTPABVi
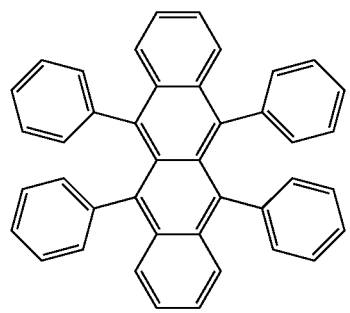
Rubrene
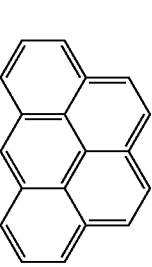
Coronene
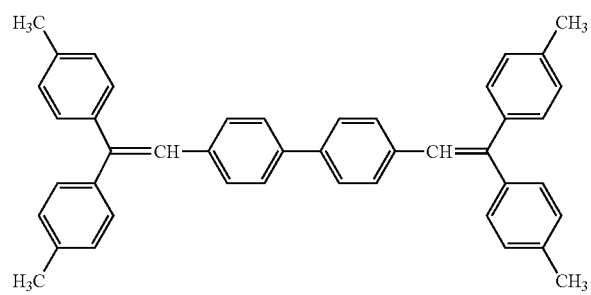
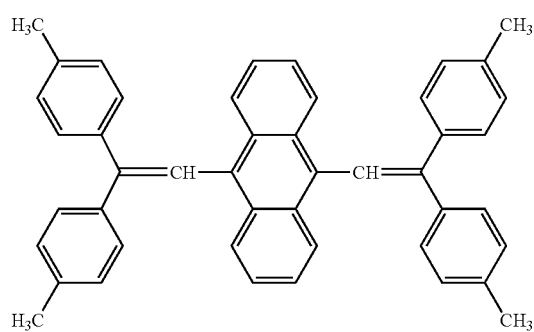

High-Molecular Luminescent Materials:

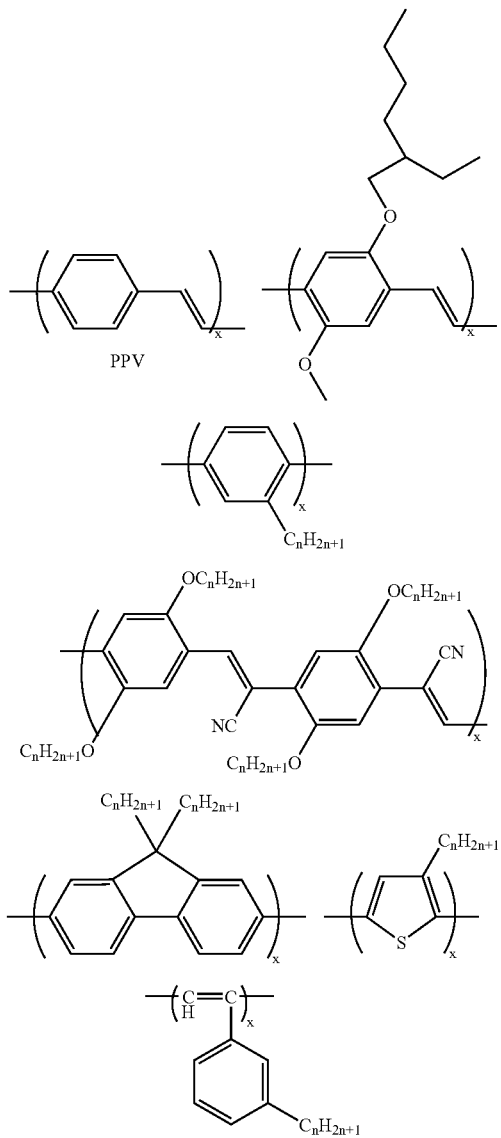

Metal Complex Luminescent Materials:

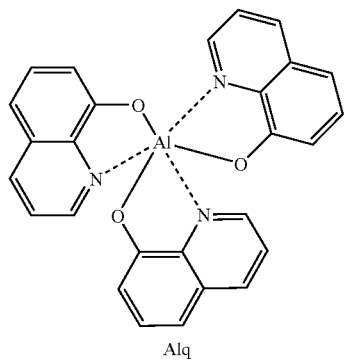

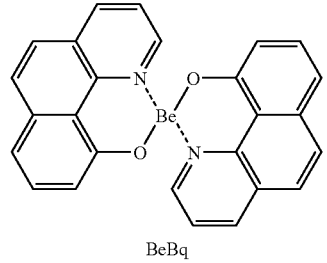

An electron injecting and transporting material may be selected from materials which facilitate the injection of electrons from the cathode and have a function to transport electrons to the luminescent layer, and may be selected taking into account a balance with the carrier mobility of the hole transporting material. Materials having the electron injection and transport function may include, but is not limited to, oxadiazole derivatives, oxazole derivatives, thiazole derivatives, thidiazole derivatives, pyrazine derivatives, triazole derivatives, triazine derivatives, perylene derivatives, quinoline derivatives, quinoxaline derivatives, fluorenone derivatives, anthrone derivatives, phenanthroline derivatives, and organometallic complexes. Some specific examples of these are shown below.

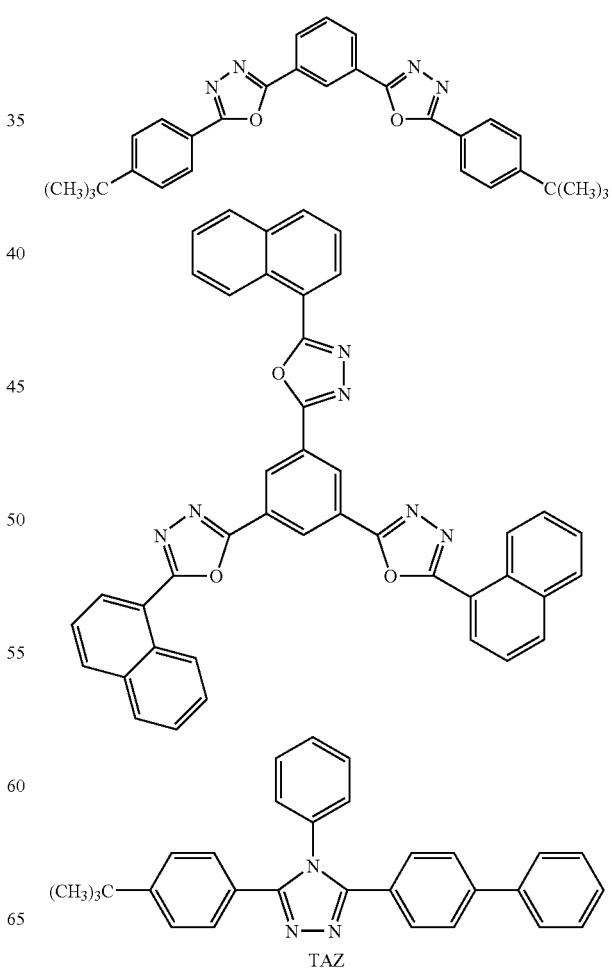

-continued

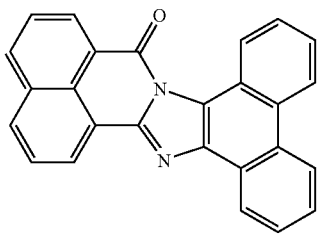

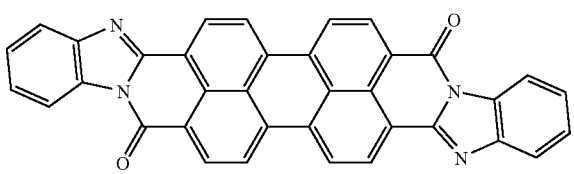

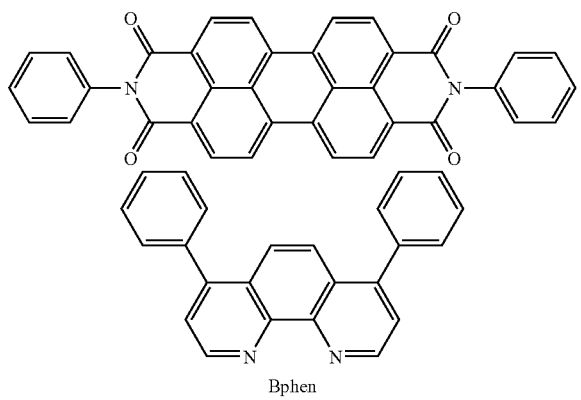

Bphen

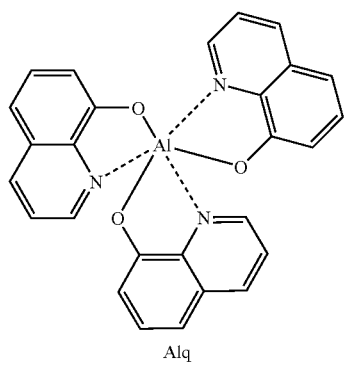

Alq

In the organic luminescent device of the present invention, the layers containing the anthryl derivative group substituted compounds represented by the general formulas [1] and [2] and the layers formed of other organic compounds are commonly formed of thin films produced by vacuum deposition, ionization deposition, sputtering, plasma deposition, or known coating (e.g., spin coating, dipping, casting, the LB (Langmuir Blodgett) process, or ink-jet printing) of a coating material prepared by dissolving materials in a suitable solvent. Especially when the films are formed by coating, the films may be formed using materials in combination with a suitable binder resin.

The binder resin may be selected from extensive binding resins, and may include, but is not limited to, polyvinyl carbazole resins, polycarbonate resins, polyester resins, polyarylate resins, polystyrene resins, ABS resins, polybutadiene resins, polyurethane resins, acrylic resins, methacrylic resins, butyral resins, polyvinyl acetal resins, polyamide resins, polyimide resins, polyethylene resins, polyether sulfone resins, diallyl phthalate resins, phenol resins, epoxy resins, silicone resins, polysulfone resins, and urea resins. These may also be used alone as homopolymers or in a mixture of two or more types as copolymers. Additives such as known plasticizers, antioxidants and ultraviolet absorbers may further optionally be used in a combination of two or more types.

Materials for the anode having a work function as large as possible are favorable, and usable are, e.g., metals themselves such as gold, platinum, silver, copper, nickel, palladium, cobalt, selenium, vanadium and tungsten, or alloys of any of these; and metal oxides such as tin oxide, zinc oxide, indium oxide, indium-tin oxide (ITO), and indium-zinc oxide. Also usable are conductive polymers such as polyaniline, polypyrrole, polythiophene, and polyphenylene sulfide. Any of these electrode materials may be used alone or may be used in combination. Also, the anode may be constituted of a single layer or may be constituted of a multiple layer.

On the other hand, materials for the cathode having a small work function are favorable, and may be used in the form of, e.g., metals themselves such as lithium, sodium, potassium, calcium, magnesium, aluminum, indium, ruthenium, titanium, manganese, yttrium, silver, lead, tin, and chromium; or alloys of two or more of these, such as lithium-indium, sodium-potassium, magnesium-silver, aluminum-lithium, aluminum-magnesium, and magnesium-indium. Metal oxides such as indium-tin oxide (ITO) may also be used. Any of these electrode materials may be used alone or may be used in a combination of two or more types. Also, the cathode may be constituted of a single layer or may be constituted of a multiple layer.

It is also preferable that at least one of the anode and the cathode is transparent or semitransparent.

In the substrate used in the present invention, there are no particular limitations. There may be used opaque substrates such as substrate made of metal and substrates made of ceramic, and transparent substrates such as glass, quartz and plastic sheets. A color filter film, a fluorescent color conversion filter film, a dielectric reflecting film or the like may be applied to the substrate to control luminescence light.

On the device produced, a protective layer or a sealing layer may be provided in order to prevent contact with oxygen, moisture, etc. The protective layer may include diamond thin film; films of inorganic materials such as metal oxides and metal nitrides; films of high-molecular materials such as fluorine resins, polyparaxylene, polyethylene, silicone resins and polystyrene resins; and photocurable resins. Also, the device may be covered with glass, a gas-impermeable film, metal or the like and itself may be packed in a suitable sealing resin.

EXAMPLES

The present invention will be described below in greater detail by giving Examples. The present invention is by no means limited to these.

Example 1
(Process of Producing Exemplary Compounds No. 15 and No. 34)

Synthesis of Intermediate (II):

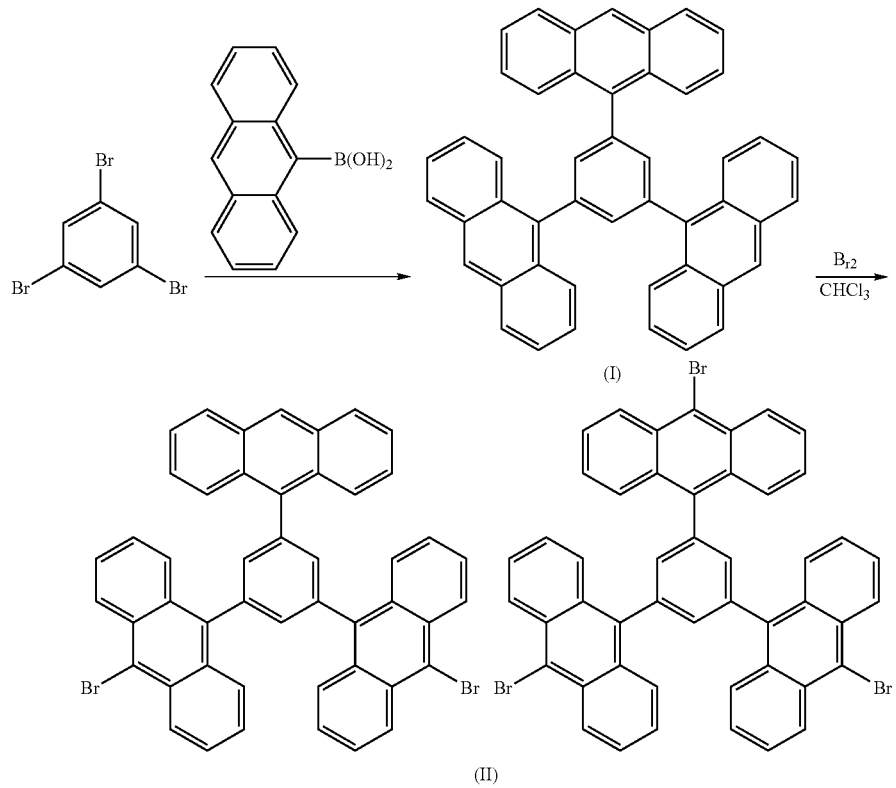

In a stream of nitrogen, 25.8 g (82 mmol) of tribromobenzene and 109.5 g (0.491 moles) of anthracene-9-boronic acid were dissolved in a mixed solvent of 1 L of desecrated toluene and 500 ml of ethanol and were stirred, followed by dropwise adding an aqueous sodium carbonate solution prepared by dissolving 86.9 g of anhydrous sodium carbonate in 800 ml of water. In a stream of nitrogen, the resulting solution was stirred for 1 hour on an oil bath heated to 80° C., and thereafter 14.2 g (12.3 mmol) of tetrakis(triphenylphosphine)palladium was added, followed by heating and stirring for about 4 hours on an oil bath heated to 80° C. The resultant reaction solution was cooled to room temperature and further cooled to 5° C., and crystals precipitated were filtered off. The crystals were dissolved in a chlorobenzene-heptane mixed solvent with heating and purified by silica gel column chromatography (chlorobenzene:heptane=1:3) to produce 25 g of an intermediate (I).

A solution of 16.7 g (27.6 mmol) of the intermediate (I) in 300 ml of chloroform was cooled to 5° C., and 9.69 g (60.6 mmol) of bromine dissolved in 70 ml of chloroform was slowly dropwise added. After the dropwise addition, the resulting solution were stirred at room temperature for 2 hours, and 300 ml of methanol was further added, followed by stirring at 5° C. for 2 hours. The precipitate formed was filtered off and dispersedly washed with acetone. The resultant solution was cooled again to 5° C., and the precipitate was filtered to produce 21 g of an intermediate (II) as a mixture of a monobromo-product, a dibromo-product and a tribromo-product (HPCL analysis, UV; area ratio: monobromo-product:dibromo-product:tribromo-product=1:2.3:3.3).

Synthesis of Exemplary Compounds. No. 15 and No. 34:

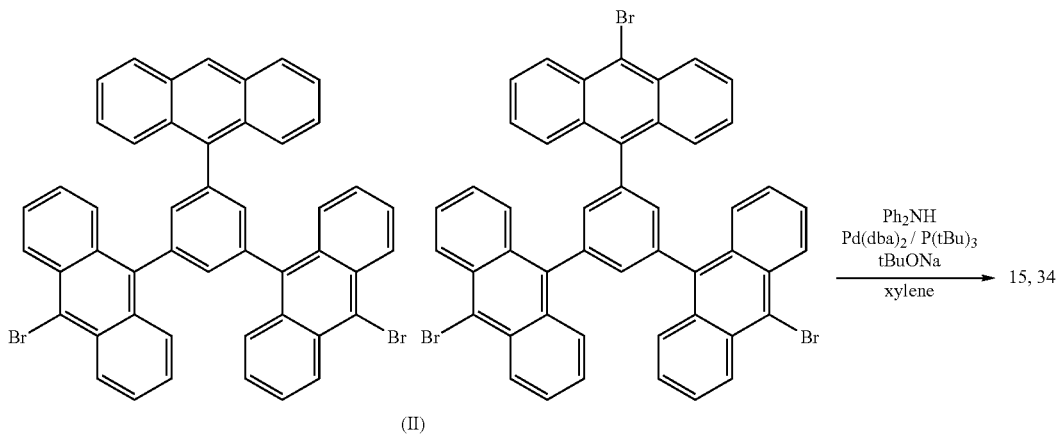

In an atmosphere of nitrogen, 361 mg (0.627 mmol) of palladium bis(benzylideneacetone) and 0.76 g (3.76 mmol) of tri-tert-butylphosphine were dissolved in 230 ml of xylene and stirred at room temperature for 1 hour. Then, 100 ml of xylene was further added, and thereafter, in a stream of nitrogen, 3 g (3.92 mmol, in terms of the dibromo-product) of the intermediate (II) was added and stirred for 5 minutes on an oil bath heated to 50° C. Then, 1.32 g (7.84 mmol) of diphenylamine dissolved in 50 ml of xylene was dropwise added and subsequently 1.13 g (11.8 mmol) of sodium tert-butoxide was added, followed by heating and stirring for about 6 hours on an oil bath heated to 130° C. The resultant reaction solution was cooled to room temperature, and 100 ml of water was added to separate a water layer and an organic layer. The water layer was extracted with toluene and ethyl acetate, and then combined with the previous organic layer, followed by drying over sodium sulfate. The solvent was distilled away, and the residue was subjected to separation and purification by silica gel column chromatography (toluene:hexane=1:3) to produce 1 g of Exemplary Compound No. 15 and 1.5 g of Exemplary Compound No. 34.

Example 2

(Process of Producing Exemplary Compounds No. 21 and No. 39)

(II) +

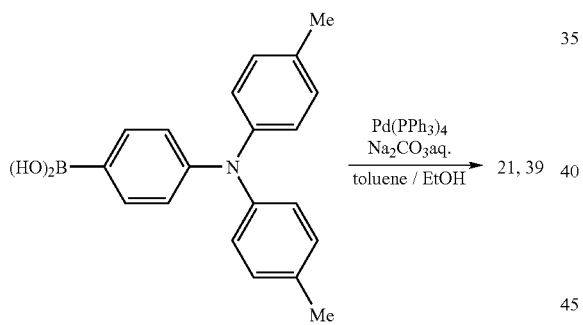

In a stream of nitrogen, 1.53 g (2 mmol, in terms of the dibromo-product) of the intermediate (II) and 1.90 g (6 mmol) of bis(4-methylphenyl)aminobenzene-4-boronic acid were dissolved in a mixed solvent of 180 ml of desecrated toluene and 90 ml of ethanol and were stirred, followed by dropwise adding an aqueous solution prepared by dissolving 0.98 g of anhydrous sodium carbonate in 30 ml of water. The resulting solution was stirred for 30 minutes, and thereafter 347 mg (0.3 mmol) of tetrakis(triphenylphosphine)palladium was added, followed by heating and stirring for about 5 hours on an oil bath heated to 80° C. The resultant reaction solution was cooled to room temperature, and thereafter 70 ml of water and 70 ml of ethyl acetate were added to separate a water layer and an organic layer. The water layer was extracted with toluene and ethyl acetate, and then combined with the previous organic layer, followed by drying with sodium magnesium. The solvent was distilled away, and the residue was purified by silica gel column chromatography (toluene:hexane=1:3) to produce 0.65 g of Exemplary Compound No. 21 and 0.7 g of Exemplary Compound No. 39.

Example 3

(Process of Producing Exemplary Compound No. 40)

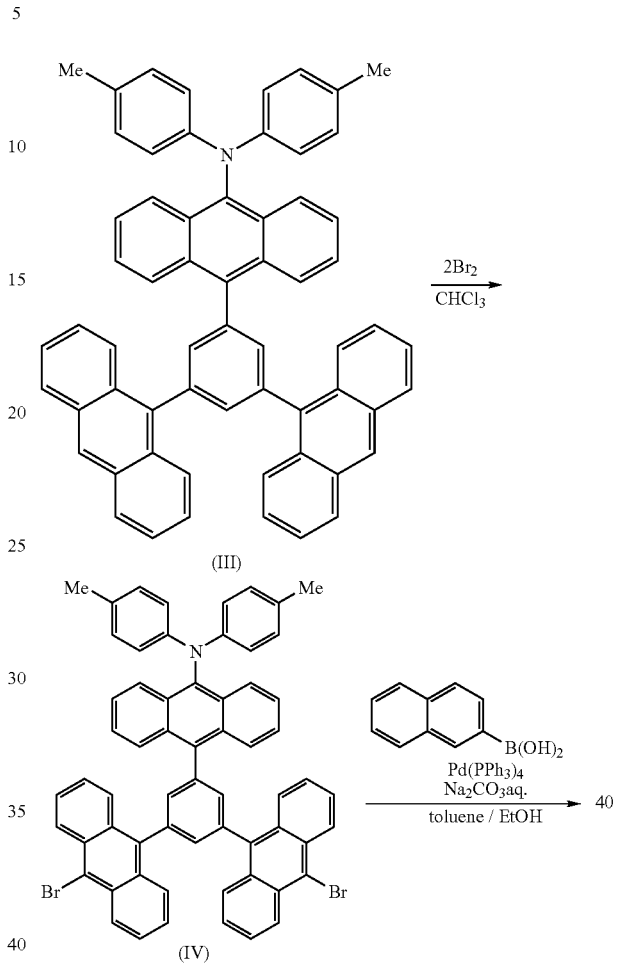

Synthesis of Intermediate (IV):

A solution of 3 g (3.74 mmol) of the intermediate (III) in 120 ml of chloroform was cooled to 5° C., and 1.2 g (7.48 mmol) of bromine dissolved in 30 ml of chloroform was slowly dropwise added. After the dropwise addition, the resulting solution was stirred at room temperature for 2 hours, and 120 ml of methanol was further added, followed by stirring at 5° C. for 2 hours. The precipitate formed was filtered off, and the precipitate filtered was dispersedly washed with acetone. The resultant solution was cooled again to 5° C., and the precipitate was filtered off to produce 2.9 g of an intermediate (IV).

Synthesis of Exemplary Compound No. 40:

In a stream of nitrogen, 2 g (2.08 mmol) of the intermediate (IV) and 1.10 g (6.42 mmol) of naphthalene-2-boronic acid were dissolved in a mixed solvent of 150 ml of desecrated toluene and 30 ml of ethanol and were stirred, followed by dropwise adding an aqueous solution prepared by dissolving 1.36 g of anhydrous sodium carbonate in 30 ml of water. The resulting solution was stirred for 30 minutes, and thereafter 0.22 g (0.19 mmol) of tetrakis (triphenylphosphine)palladium was added, followed by heating and stirring for about 7 hours on an oil bath heated to 80° C. The resultant reaction solution was cooled to room temperature, and thereafter 70 ml of water and 70 ml of ethyl acetate were added to separate a water layer and an organic layer. The water layer was extracted with toluene and ethyl acetate, and then combined with the previous organic layer, followed by drying over sodium magnesium. The solvent was distilled away, and the residue was purified by silica gel column chromatography (toluene:hexane=1:3) to produce 1.3 g of Exemplary Compound No. 40.

Example 4

An organic luminescent device having the structure shown in FIG. 3 was produced in the following way.

On a glass substrate as the substrate 1, an indium-tin oxide (ITO) film as the anode 2 was formed by sputtering in a layer thickness of 120 nm, and this was used as a transparent conductive support substrate. This substrate was subjected to ultrasonic cleaning with acetone and isopropyl alcohol (IPA) in order, and subsequently to boiling cleaning with IPA, followed by drying. The substrate was further subjected to UV/ozone cleaning, and was used as the transparent conductive support substrate.

Using as a hole transporting material a compound represented by the following structural formula, its chloroform solution was so prepared as to be in a concentration of 0.5% by weight.

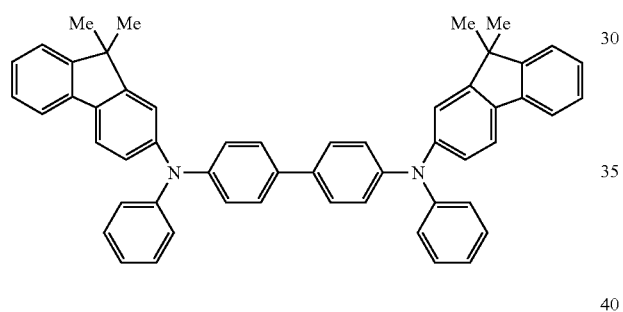

This solution was dropped on the above ITO electrode, and spin-coating was carried out first at the number of revolutions of 500 rpm for 10 seconds and then at the number of revolutions of 1,000 rpm for 1 minute to form a film (thin film). Thereafter, the film was dried for 10 minutes in a 80° C. vacuum oven to completely remove the solvent remaining in the thin film. The hole transport layer 5 thus formed was in a thickness of 50 nm. Next, on the hole transport layer 5, the above Exemplary Compound No. 21 was vacuum-deposited to provide as the luminescent layer 3 a luminescent layer 3 of 20 nm in thickness. At the time of the vacuum deposition, the film was formed under the conditions of a degree of vacuum of $1.0 \times 10^{-4}$ Pa and a rate of film formation of 0.2 to 0.3 nm/sec.

As the electron transport layer 6, a batho-phenanthroline (BPhen) film was formed by vacuum deposition in a layer thickness of 40 nm. At the time of the vacuum deposition, the film was formed under the conditions of a degree of vacuum of $1.0 \times 10^{-4}$ Pa and a rate of film formation of 0.2 to 0.3 nm/sec.

Next, using a vacuum deposition material composed of an aluminum-lithium alloy (lithium concentration: 1 atom %), a metal layer film of 10 nm in thickness was formed by vacuum deposition, and an aluminum film of 150 nm in thickness was further formed by vacuum deposition to produce an organic luminescent device having an aluminum-lithium alloy film as an electron injection electrode (the cathode 4). At the time of the vacuum deposition, the film was formed under the conditions of a degree of vacuum of $1.0 \times 10^{-4}$ Pa and a rate of film formation of 1.0 to 1.2 nm/sec.

The organic luminescent device (organic EL device) thus obtained was covered with a protecting glass plate in a dry air atmosphere and sealed with an acrylic-resin adhesive so as not to cause device deterioration due to adsorption of moisture.

To the device thus obtained, a voltage was applied setting the ITO electrode (anode 2) as the positive pole and the Al—Li electrode (cathode 4) as the negative pole, where green luminescence of 320 cd/m² in luminance and 8 lm/W in luminescence efficiency was observed at an applied voltage of 3 V.

The voltage was further applied for 100 hours in a nitrogen atmosphere, keeping current density at 3.0 mA/cm². As a result, the initial luminance 300 cd/m² came to be 280 cd/m² after 100 hours, showing small luminance deterioration.

Comparative Example 1

A device was produced in the same manner as in Example 4 except that a comparative compound shown below was used in place of Exemplary Compound No. 21. Evaluation was made in the same way. Green luminescence of 190 cd/m² in luminance and 2 lm/W in luminescence efficiency was observed at an applied voltage of 3 V.

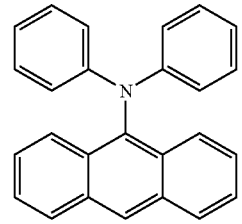

The voltage was further applied for 100 hours in a nitrogen atmosphere, keeping current density at 3.0 mA/cm². As a result, the initial luminance 180 cd/m² came to be 80 cd/m² after 100 hours, showing a great luminance deterioration.

Examples 5 to 7

Devices were produced in the same manner as in Example 4 except that compounds shown in Table 1 were used in place of Exemplary-Compound No. 21. Evaluation was made in the same way. Results obtained are shown in Table 1.

TABLE 1

| Example: | Exemplary Compound No. | Applied voltage (V) | Luminance (cd/m²) | Luminescence efficiency (lm/W) |
|---|---|---|---|---|
| 5 | 1 | 3 | 245 | 4 |
| 6 | 7 | 3 | 260 | 5 |
| 7 | 29 | 3 | 300 | 7 |

Example 8

An organic luminescent device having the structure shown in FIG. 3 was produced in the same manner as in Example 4 except that 2-bis[2-(9,9-diemethylfluorenyl)]phenanthroline was used in the electron transport layer 6 and Exemplary Compound No. 15 shown previously was vacuum-deposited to form the luminescent layer 3.

To the device thus obtained, a voltage was applied setting the ITO electrode (anode 2) as the positive pole and the Al—Li electrode (cathode 4) as the negative pole, where green luminescence of 300 cd/cm$^2$ in luminance and 7 lm/W in luminescence efficiency was observed at an applied voltage of 3 V.

Example 9

An organic luminescent device was produced in the same manner as in Example 8 except that Exemplary Compound No. 19 shown previously was vacuum-deposited to form the luminescent layer 3.

To the device thus obtained, a voltage was applied setting the ITO electrode (anode 2) as the positive pole and the Al—Li electrode (cathode 4) as the negative pole, where blue-green luminescence of 250 cd/m$^2$ in luminance and 4 lm/W in luminescence efficiency was observed at an applied voltage of 3 V.

Example 10

An organic luminescent device was produced in the same manner as in Example 8 except that Exemplary Compound No. 6 shown previously was vacuum-deposited to form the luminescent layer 3.

To the device thus obtained, a voltage was applied setting the ITO electrode (anode 2) as the positive pole and the Al—Li electrode (cathode 4) as the negative pole, where orange luminescence of 220 cd/m$^2$ in luminance and 3 lm/W in luminescence efficiency was observed at an applied voltage of 3 V.

Examples 11 to 16

Devices were produced in the same manner as in Example 8 except that compounds shown in Table 2 were used to form the luminescent layer 3. Evaluation was made in the same way. Results obtained are shown in Table 2.

TABLE 2

| Example: | Exemplary Compound No. | Applied voltage (V) | Luminance (cd/m$^2$) | Luminescence efficiency (lm/W) |
|---|---|---|---|---|
| 11 | 5 | 3 | 280 | 7 |
| 12 | 16 | 3 | 380 | 10 |
| 13 | 17 | 3 | 345 | 8 |
| 14 | 23 | 3 | 285 | 7 |
| 15 | 40 | 3 | 250 | 5 |
| 16 | 51 | 3 | 270 | 6 |

Example 17

An organic luminescent device having the structure shown in FIG. 3 was produced in the same manner as in Example 7 except that Exemplary Compound No. 1 and Exemplary Compound No. 36 were vacuum-deposited together (weight ratio: 15:100) to form the luminescent layer 3.

To the device thus obtained, a voltage was applied setting the ITO electrode (anode 2) as the positive pole and the Al—Li electrode (cathode 4) as the negative pole, where green luminescence of 225 cd/m$^2$ in luminance and 5 lm/W in luminescence efficiency was observed at an applied voltage of 3 V.

Example 18

To the device produced in Example 8, a voltage was applied for 100 hours in an atmosphere of nitrogen, keeping current density at 3.0 mA/cm$^2$. As a result, the initial luminance 290 cd/m$^2$ came to be 270 cd/m$^2$ after 100 hours, showing small luminance deterioration.

Example 19

To the device produced in Example 14, a voltage was applied for 100 hours in an atmosphere of nitrogen, keeping current density at 3.0 mA/cm$^2$. As a result, the initial luminance 280 cd/m$^2$ came to be 270 cd/m$^2$ after 100 hours, showing small luminance deterioration.

Comparative Example 2

An organic luminescent device was produced in the same manner as in Example 8 except that the following unsubstituted comparative compound was used to form the luminescent layer 3.

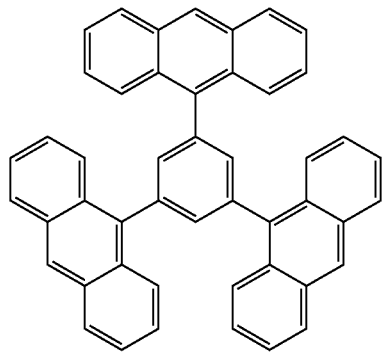

To the device thus obtained, a voltage was applied setting the ITO electrode 2 as the positive pole and the Al—Li electrode 4 as the negative pole, where blue weak luminescence of 240 cd/m$^2$ in luminance and 0.2 lm/W in luminescence efficiency was observed at an applied voltage of 6 V.

As having been described above by giving embodiments and examples, the anthryl derivative group substituted compounds represented by the general formulas [1] and [2] have been developed on the basis of such designing precept as stated previously. The organic luminescent device making use of the material of the present invention has afforded high-efficiency luminescence at a low applied voltage. Also, by the replacement of substituents, various luminescence colors are obtainable with ease and superior durability is also obtainable.

What is claimed is:

1. An organic luminescent device comprising a pair of electrodes composed of an anode and a cathode, and an organic compound layer held between the electrodes, wherein the organic compound layer contains at least one type of anthryl derivative substituted compound represented by the following general formula [1]:

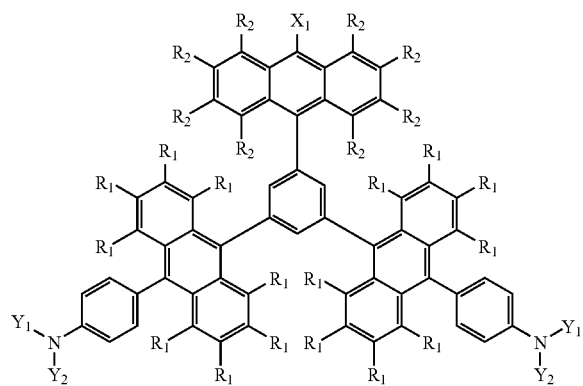

[1]

wherein:

$Y_1$ and $Y_2$ are each independently a group selected from the group consisting of a substituted or unsubstituted alkyl group, a substituted or unsubstituted aralkyl group, a substituted or unsubstituted aryl group and a substituted or unsubstituted heterocyclic group, or $Y_1$ and $Y_2$ may be combined together to form a ring, and $Y_1$'s and $Y_2$'s in different anthryl derivative groups may be the same or different;

$X_1$ is a group selected from the group consisting of a hydrogen atom, a deuterium atom, a halogen atom, a substituted or unsubstituted alkyl group, a substituted or unsubstituted alkenyl group, a substituted or unsubstituted alkynyl group, a substituted or unsubstituted aralkyl group, a substituted or unsubstituted alkoxyl group, a substituted or unsubstituted sulfide group, a substituted or unsubstituted aryl group, a substituted or unsubstituted heterocyclic group, and a substituted silyl group; and $R_1$'s and $R_2$'s are each independently a group selected from the group consisting of a hydrogen atom, a deuterium atom, a halogen atom, a substituted or unsubstituted alkyl group, a substituted or unsubstituted aryl group, a substituted or unsubstituted alkoxyl group, and a substituted or unsubstituted amino group.

2. An organic luminescent device according to claim 1, wherein the anthryl derivative substituted compound is one represented by the following formula:

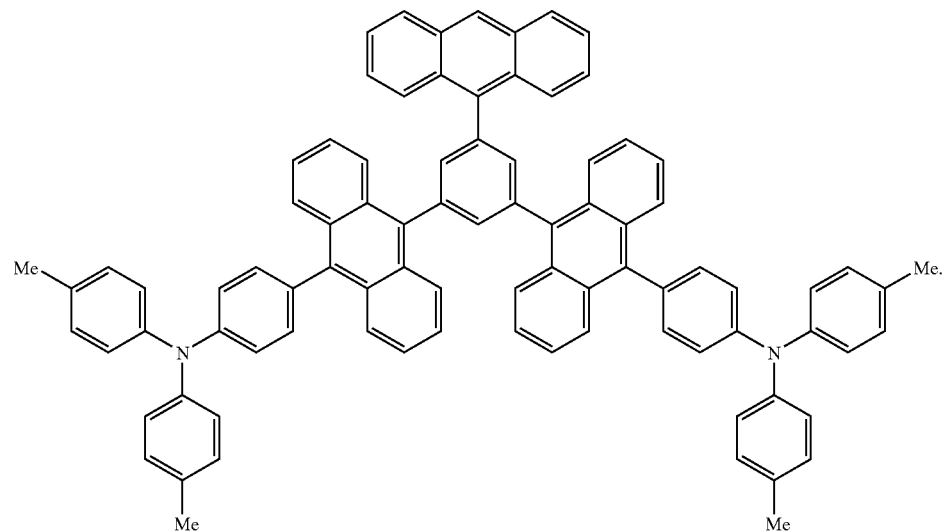

3. An organic luminescent device according to claim 1, wherein the anthryl derivative substituted compound is one represented by the following formula:
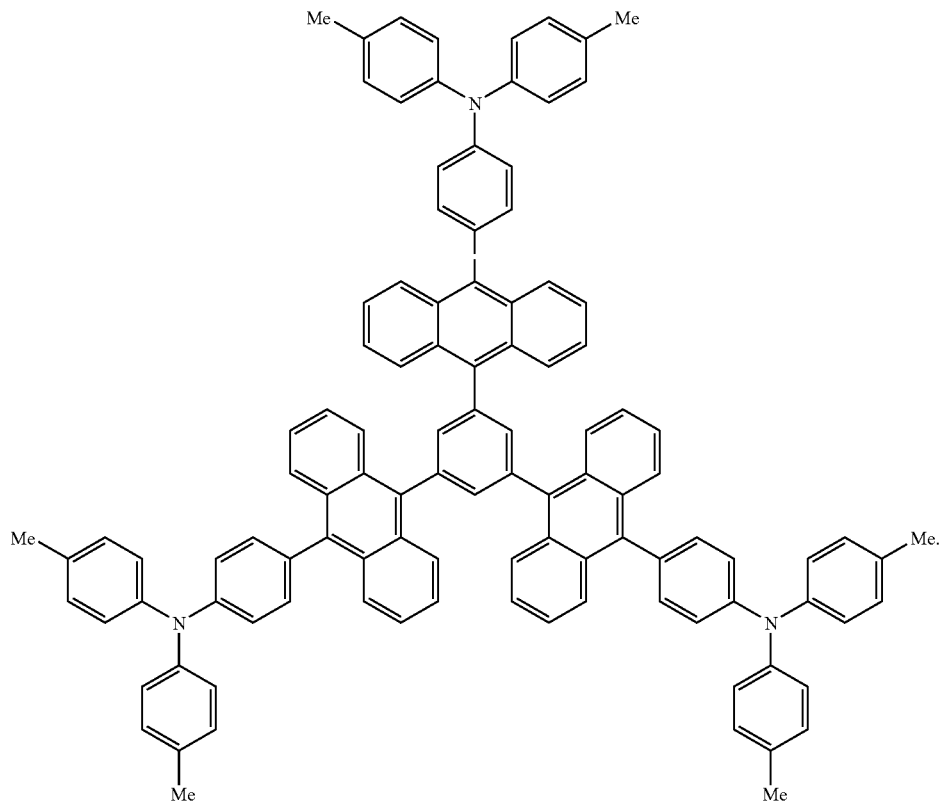
4. An organic luminescent device according to claim 1, wherein the organic compound layer is a luminescent layer.
* * * * *

UNITED STATES PATENT AND TRADEMARK OFFICE
CERTIFICATE OF CORRECTION

PATENT NO. : 7,309,533 B2
APPLICATION NO. : 11/500885
DATED : December 18, 2007
INVENTOR(S) : Akihito Saitoh et al.

It is certified that error appears in the above-identified patent and that said Letters Patent is hereby corrected as shown below:

ON COVER PAGE AT (56) FOREIGN PATENT DOCUMENTS

"3008897" should read --3-008897--.

ON COVER PAGE AT (56) OTHER PUBLICATIONS

After "Baldo et al.,": "organic" should read --Organic--.

COLUMN 9

Line 6, "amino-groups," should read --amino groups,--.

COLUMN 22

Exemplary Compound 27, " 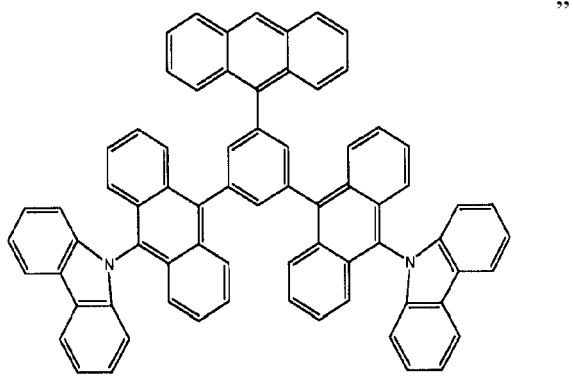 "

should read

UNITED STATES PATENT AND TRADEMARK OFFICE
CERTIFICATE OF CORRECTION

PATENT NO. : 7,309,533 B2 Page 2 of 3
APPLICATION NO. : 11/500885
DATED : December 18, 2007
INVENTOR(S) : Akihito Saitoh et al.

It is certified that error appears in the above-identified patent and that said Letters Patent is hereby corrected as shown below:

-- --.

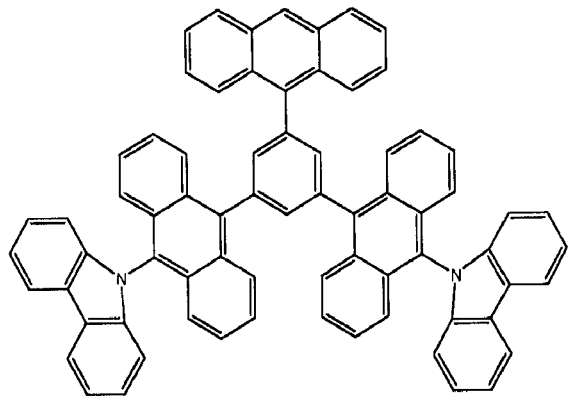

COLUMN 37

Line 25, "transport-layer" should read --transport layer--.

COLUMN 49

Line 39, "desecrated" should read --deaerated--.

COLUMN 51

Line 51, "desecrated" should read --deaerated--.

COLUMN 52

Line 49, "desecrated" should read --deaerated--.

UNITED STATES PATENT AND TRADEMARK OFFICE
CERTIFICATE OF CORRECTION

PATENT NO. : 7,309,533 B2
APPLICATION NO. : 11/500885
DATED : December 18, 2007
INVENTOR(S) : Akihito Saitoh et al.

It is certified that error appears in the above-identified patent and that said Letters Patent is hereby corrected as shown below:

COLUMN 54

Line 53, "Exemplary-Compound" should read --Exemplary Compound--.

COLUMN 55

Line 5, "2-bis[2-(9,9-diemethylfluorenyl)]" should read --2,9-bis[2-(9,9-diemethylfluorenyl)]--.

Signed and Sealed this

Twenty-ninth Day of July, 2008

JON W. DUDAS
*Director of the United States Patent and Trademark Office*